(12) United States Patent
Rodgers

(10) Patent No.: US 7,289,887 B2
(45) Date of Patent: Oct. 30, 2007

(54) SYSTEMS AND METHODS FOR REMOTE POWER MANAGEMENT USING IEEE 802 BASED WIRELESS COMMUNICATION LINKS

(75) Inventor: Mark E. Rodgers, Jackson, MS (US)

(73) Assignee: SmartSynch, Inc. MS (US)

( * ) Notice: Subject to any disclaimer, the term of this patent is extended or adjusted under 35 U.S.C. 154(b) by 279 days.

(21) Appl. No.: 10/729,532

(22) Filed: Dec. 5, 2003

(65) Prior Publication Data

US 2005/0065742 A1    Mar. 24, 2005

Related U.S. Application Data

(63) Continuation-in-part of application No. 10/658,493, filed on Sep. 8, 2003, now abandoned.

(51) Int. Cl.
*G05D 11/00* (2006.01)
(52) U.S. Cl. .................. 700/295; 700/286; 702/62
(58) Field of Classification Search .............. 700/286, 700/295; 702/61–62; 307/112, 139; 340/870.02
See application file for complete search history.

(56) References Cited

U.S. PATENT DOCUMENTS

| | | | |
|---|---|---|---|
| 5,056,107 A | 10/1991 | Johnson et al. | |
| 5,553,094 A | 9/1996 | Johnson et al. | |
| 5,565,783 A | 10/1996 | Lau et al. | |
| 5,598,349 A * | 1/1997 | Elliason et al. | 700/295 |
| 5,627,759 A | 5/1997 | Bearden et al. | |
| 5,644,173 A * | 7/1997 | Elliason et al. | 307/34 |
| 5,682,133 A | 10/1997 | Johnson et al. | |
| 5,682,139 A | 10/1997 | Pradeep et al. | |
| 5,696,695 A * | 12/1997 | Ehlers et al. | 700/286 |
| 5,845,230 A | 12/1998 | Lamberson | |
| 5,883,866 A | 3/1999 | Shimizume et al. | |
| 5,923,269 A | 7/1999 | Shuey et al. | |
| 5,926,776 A * | 7/1999 | Glorioso et al. | 702/130 |
| 5,963,650 A | 10/1999 | Simionescu et al. | |
| 6,023,223 A | 2/2000 | Baxter, Jr. | |
| 6,028,522 A | 2/2000 | Petite | |
| 6,073,169 A | 6/2000 | Shuey et al. | |
| 6,088,659 A | 7/2000 | Kelley et al. | |
| 6,100,817 A | 8/2000 | Mason, Jr. et al. | |
| 6,115,676 A | 9/2000 | Rector et al. | |
| 6,133,850 A | 10/2000 | Moore | |
| 6,167,389 A * | 12/2000 | Davis et al. | 705/412 |
| 6,181,985 B1 * | 1/2001 | O'Donnell et al. | 700/295 |

(Continued)

*Primary Examiner*—Alexander Kosowski
(74) *Attorney, Agent, or Firm*—Morris, Manning & Martin, LLP

(57) ABSTRACT

Systems and methods are disclosed for using 802.11 based wireless protocols in various energy management applications wherein a host controller uses various types of communication networks to distribute information to an on-premise processor that in turn uses 802.11 based wireless protocols to communicate with various types of end devices, such as utility meters. Various forms of communication are defined between the end device, the on-premise processor, and the energy management host for accomplishing power load control, including determining when to activate or deactivate a load, requesting permission to activate a load, reading usage data, activating or deactivating a meter, and determining rate schedules. A flexible scheme allows control to be shifted to be resident in various entities. The architecture is applicable not only for power load control, but other control type and metering devices.

18 Claims, 20 Drawing Sheets

U.S. PATENT DOCUMENTS

| | | | |
|---|---|---|---|
| 6,185,483 B1* | 2/2001 | Drees | 700/295 |
| 6,218,953 B1 | 4/2001 | Petite | |
| 6,281,601 B1* | 8/2001 | Edelman et al. | 307/29 |
| 6,437,692 B1 | 8/2002 | Petite et al. | |
| 6,493,643 B1* | 12/2002 | Aisa | 702/60 |
| 6,671,586 B2* | 12/2003 | Davis et al. | 700/295 |
| 6,680,547 B1* | 1/2004 | Dailey | 307/31 |
| 6,681,154 B2* | 1/2004 | Nierlich et al. | 700/286 |
| 6,891,478 B2* | 5/2005 | Gardner | 340/635 |
| 2003/0233201 A1* | 12/2003 | Horst et al. | 702/62 |
| 2004/0078154 A1* | 4/2004 | Hunter | 702/61 |
| 2004/0113810 A1* | 6/2004 | Mason et al. | 340/870.02 |
| 2004/0138786 A1* | 7/2004 | Blackett et al. | 700/295 |
| 2005/0065743 A1* | 3/2005 | Cumming et al. | 702/62 |

* cited by examiner

Meter Reading Data Structure

SYSTEMS AND METHODS FOR REMOTE POWER MANAGEMENT USING IEEE 802 BASED WIRELESS COMMUNICATION LINKS

RELATED APPLICATIONS

This application is a continuation-in-part of application Ser. No. 10/658,493 filed on Sep. 8, 2003 now abandoned.

FIELD OF INVENTION

This invention is directed to systems and methods for remote power management using the IEEE 802 suite of wireless protocols to effect various power management functions including: power load control, power meter activation and deactivation, and utility meter data gathering for residential and commercial applications.

BACKGROUND AND SUMMARY OF THE INVENTION

The growth in energy consumption has outstripped the power generating capabilities in various areas. It is not uncommon in various regions for power utilities to mandate temporary reductions in power usage because of limited power generating capabilities. This is most prevalent in the summertime in conjunction with hot weather, when air conditioning usage peaks. Such air conditioning loads often represents the single largest power consumption loads for many residential and business locations.

In other instances, the power supply in the aggregate for a region is able to meet the power demand for the region, but limitations in the power distribution and transmission infrastructure result in instability, or unequal availability of power throughout the region. The blackout in the northeastern United States on Aug. 14, 2003 illustrates that impact of problems in power transmission and distribution can also lead to power outages and load imbalances.

If power consumption exceeds the available supply, regardless of insufficient power generation or inadequate distribution and transmission facilities, the power grid has automatic safeguards to limit the demand and prevent permanent damage to the power grid. These procedures may result in power blackouts and are undesirable as they indiscriminately remove power to all users located in a service area without warning. Another approach is to temporarily eliminate power on a planned basis to a selected service area. While still undesirable, this approach has the benefit of being planned and the impact (e.g., area effected) is known in advance. However, the economic costs of such blackouts is significant, and has been estimated by the government to cost the U.S. economy between $119-$188 billion dollars annually.

More preferable to rolling blackouts are approaches where power is maintained, but consumption is reduced so as to avoid a subsequent blackout. Typically, large power consumers (e.g., commercial and industrial customers) voluntarily enter into a demand load reduction program offered by the power utility. These arrangements are typically regulated by an appropriate state regulatory agency (e.g., Public Utility Commission) and in this arrangement customers agree to reduce or eliminate their load consumption upon request of the utility in exchange for a lower energy prices (power rates). Customers are typically requested to reduce their power consumption for a fixed number of hours (e.g., four hours) upon request, for a fixed number of times a year (e.g., six per year). If at the time of the request the customer does not reduce their power, then a penalty is levied on the customer. This requires the power utility to individually contact large energy consumers and request load reduction, which typically is accomplished by user deactivating a power load. Frequently, these users 'turn off' or deactivate air conditioning systems or other industrial processes for a limited time period when usage is predicted to peak (e.g., typically afternoon). Often, peak usage is predictable and involves comparing past usage and anticipated temperatures. Thus, the need for limiting consumption can be often predicted hours in advance.

Typically, the power utility maintains a list of customers that consume large amounts of power, with names and telephone numbers for the purpose of requesting voluntary reduction in power usage. If a power reduction is required, utility personnel will telephone the customers and request power reduction. Under the incentive/disincentive program characteristics, customers typically comply as the alternative typically results in penalties and the ultimate result in a blackout.

The process of manually contacting and deactivating power loads is labor intensive and slow. Further, once a power utility contacts a customer for load reduction, the power utility has no immediate feedback as to whether the customer did reduce their power consumption and the associated impact. Typically, determination of a power load reduction is determined at the end of the billing cycle, and it is not clear whether the load was reduced for the entire time period or not. In addition, the power utility is not readily able to determine the real time power demand reduction by such power load demand activities, except at a very aggregate level. Consequently, the power utility may request far more (or less) power consumers to reduce their load than is required. Further, the power company is not able to tailor the time period for what is required. For example, the power utility may request load deactivation for a 4 hour window, but if after 3 hours it is determined that no further load reductions are required, the utility may not contact the various power consumers indicating that load reduction is not longer required. Contacting each of the power consumers may take so long so as to render the process moot.

Clearly, an automated approach for managing loads would be preferable. Further, the management of power loads may allow distinguishing between voluntary reduction and involuntary reduction. For example, if a power provider requires reducing power consumption, it may be preferable to obtain power reduction by voluntary load reduction, rather, than to institute involuntary power reduction. Typically, only if the voluntary reductions are insufficient are involuntary power reductions instituted. Thus, in managing loads, a user may require to know the distinction whether an indication for power reduction is a voluntary request or a precursor to a demand for power reduction.

Further, automated approaches may allow flexibility in defining load reduction programs. Users may selectively volunteer to reduce their power consumption if economic incentives are provided to them even, if they have not enlisted into a traditional power load reduction scheme. Thus, users not enlisted in a power load reduction scheme could still be offered an economic incentive via variable rate schedules for power consumption. A normal, or 'off peak' usage rate indicates the rate normally used to calculate a bill for power usage while a 'peak rate' indicates a higher rate for peak demand. However, communication of a dynamic schedule of peak/off peak rates can be scheduled on a real time basis to hundreds or thousands of users that would not be practical on a manual basis. Therefore, an automated approach for communicating rate schedules would be preferable.

Existing technology has not proven practical in many instances in addressing these problems, partly from a cost perspective. However, the wide scale development of a relatively recent developed wireless LAN standard known as IEEE 802.11 and 802.15.4 allows the low cost application of wireless technology to address many of the above problems, as well as providing additional benefits.

A major impediment to the application of wireless data communication technology is that in many circumstances, radio transmission is limited by regulation by the FCC. The FCC defines frequency bands, ('spectrum') which are subject to various regulations regarding its use and technical operation. For example, transmission of radio frequencies in most spectrum is regulated and only available for use by licensed entities. Thus, a power utility desiring to utilize wireless technology to remotely manage power loads would have to, in many cases, obtain a FCC license and comply with the associated regulations. In many instances, the regulatory compliance is complicated, and obtaining a license for using the spectrum can be very difficult and costly. Typically, a license requires a significant revenue producing application to justify its use.

The FCC has allocated a portion of the spectrum for unlicensed use, as defined in a portion of the regulations known as 'Part 15' of Title 47 of the Code of Federal Regulations. So-called 'Part 15' devices include garage door openers, cordless telephones, walkie-talkies, baby monitors, etc. These devices operate on defined channels in frequency bands and are subject to interference from other devices. To minimize interference, the FCC limits the maximum power that may be used during transmission.

A technology developed initially for the military radio communications, called 'spread spectrum' has been adapted for cellular applications and is now available for use in other applications at very economical costs. This technology has the benefit of minimizing interference from other devices using the same bandwidth. This technology is mandated by the FCC for equipment transmitting in a portion of the unlicensed spectrum, namely frequencies of 2.4 to 2.4835 GHz. The devices in this range typically are allowed to transmit at a maximum of 1 watt, though most transmit at a lower power. This technology allows a variety of users to share the spectrum and minimize interference with each other. Heretofore, the historical approach to minimizing such interference was to license the frequency to a specific entity, which in turn coordinates individual users (typically in the role of a service provider in relation to its subscribers).

The IEEE (Institute of Electrical and Electronics Engineers) sponsors various standards settings bodies, and the group known by the numerical designator "802" is responsible for various Local Area Network (LAN) standards. A group formed to define various wireless technical standards for LAN standards, is known as 802.11. This group has defined various approaches for using spread spectrum techniques in the unlicensed 2.4-2.4835 GHz spectrum for LANs and has spawned an entire industry of manufacturers building equipment allowing wireless data communication from various devices including laptops, PDAs, and other devices.

The 802.11 group has divided into various task groups focusing on various technologies and has evolved over time. The following lists some of the task groups and their focus:

802.11—Wireless LAN Physical and MAC layer specification (2.4 GHz.),
802.11a—Wireless LAN Physical and MAC layer specification (5 Ghz),
802.11b—Higher speed (5.5 and 11 Mbps),
802.11c—Bridge Operations,
802.11d—Operation in additional regulatory domains,
802.11e—Quality of Service parameters,
802.11f—Multi-vendor access point interoperability Access Distribution Systems,
802.11g—Higher rate (20 Mbps) extensions in the 2.4 GHz band,
802.11h—Enhancements for Dynamic Channel Selection,
802.11i—Security and Authentication.

Thus, the 802.11 suite of protocols encompasses a variety of past and present protocols designed to inter-work together.

The 802.11 protocols are based typically on using TCP/IP protocols, which are well known in the art and adapted from wireline LAN usage. This facilitates interworking of existing infrastructure (e.g., hardware and software) for use with the wireless LAN equipment.

The wireless LAN task groups have defined various wireless architectures including end-points (also called stations) that originate and terminate information, and access points that provide access to a distribution infrastructure for extended communication. The 802.11 standard defines various capabilities and services associated with an end device pertinent to wireless operation. For example, 802.11 defines procedures to authenticate an end-point to an access point, associate/disassociated an end-point to an access point, ensure privacy and security, and transfer data between an 802.11 LAN and non-802.11 LAN.

The IEEE 802.15.4 wireless standard is targeted to providing lower bandwidth communication to devices with a primary goal of minimizing power requirements, and thus providing maximum batter life for a battery powered transmitter. The range for 802.15.4 devices is typically limited to about 30 meters for indoor applications, but can reach 300 meters based on high power level transmissions and higher quality antennas in an exterior environment. This greater distance is sufficient to provide communication between devices located in power meters in a typical residential environment.

The development of these standards along with industry cooperation to ensure interoperability has lead to equipment which when certified is termed "Wi-Fi" with respect to the 802.11 based equipment and can provide for wireless data communication heretofore not possible. The large-scale development of specialized semiconductors has lead to economies of scale allowing low cost equipment that heretofore has not been possible for wireless products. Thus, the use of 802-based wireless equipment provides a whole new opportunity for communication capabilities for devices heretofore not possible. This allows greater automation and control for applications previously not considered.

DETAILED DESCRIPTION

Figure 1:
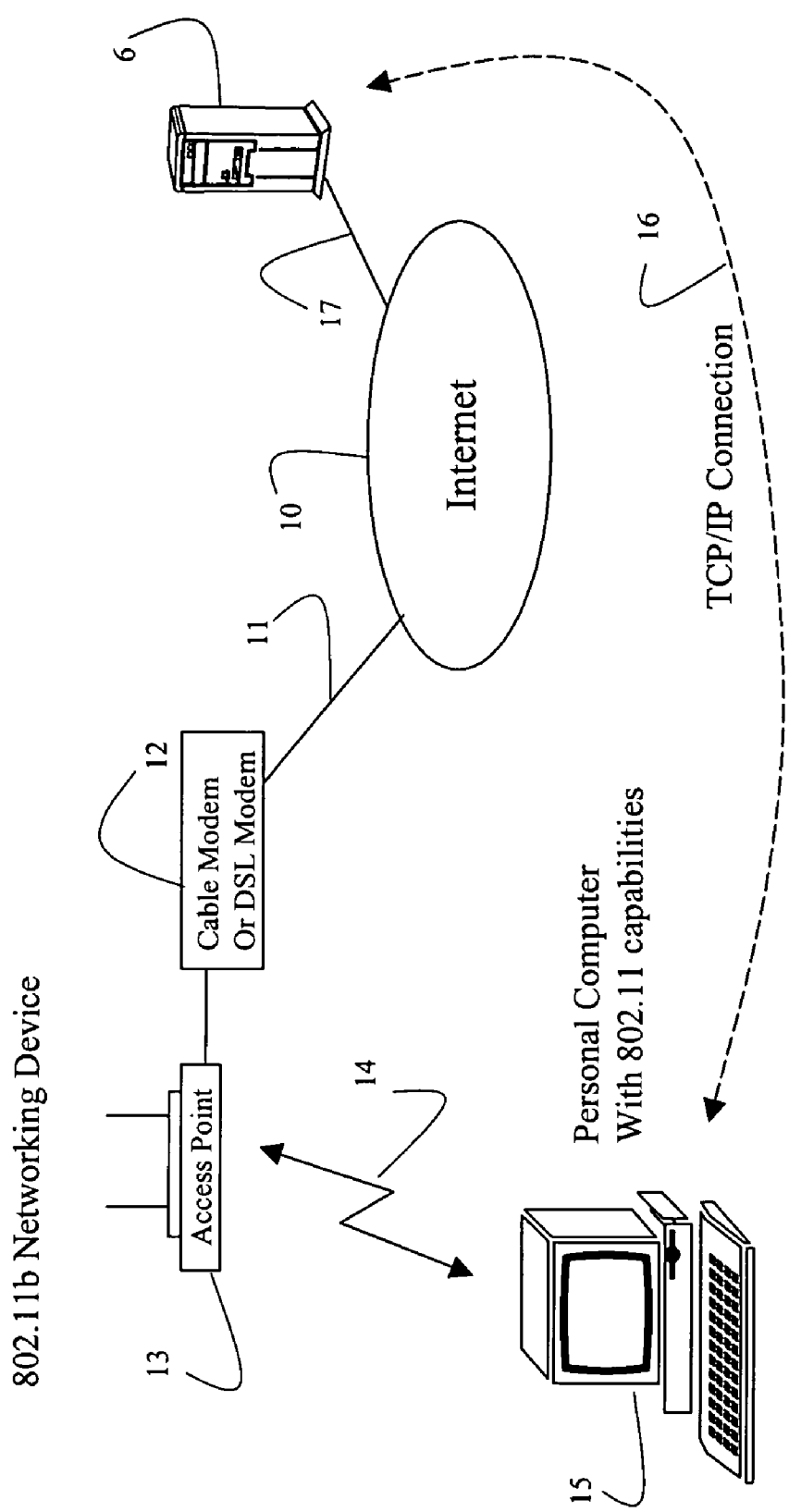
FIG. 1a illustrates the prior art of an application of 802.11b wireless communication involving a personal computer.
FIG. 1b illustrates the prior art of an architecture of 802.15.4 wireless devices.

The present invention is directed, in part, to remote energy load management, including power load control, real time load curtailment verification, meter activation/deactivation, and meter reading. Although the principles of the present invention are largely illustrated using a power meter and load control device, the principles equally apply to other embodiments of resource management. For example, in lieu of a power load and power meter, a natural gas flow controlled by a valve or gas meter could be used. Other examples include devices controlling resources in the form of fluids, solids, and the corresponding devices for metering or handling such fuel resources as coal, oil, gasoline, diesel fuel, kerosene, etc. A variety of measured resources controlled by a metering device may be adapted to the principles of the present invention. Thus, illustrating the principles by using a power meter should not be construed to limit application of principles of present invention solely to such embodiments.

One of the several main functions associated with energy management include power load control, or simply 'load control.' This refers to an external entity, which in some cases is associated with the power provider (e.g., power utility company) influencing the control of a power load. The 'control' of the load can take various forms, including deactivating a load, requesting deactivation of a load, requesting deferment of activation of a load, requesting the activation of on site generating capacity (e.g. distributed generation) or even advising an intelligent load controller of the relative rates associated with power consumption. For example, one embodiment of load control is controlling the activation of an air conditioning system. For many energy related applications, air conditioning systems represent the single largest power load at a location. Typically, the control of whether such systems are 'on' or 'off' occurs using a thermostat in an autonomous manner. More sophisticated building control systems may integrate a processor to control the A/C systems so that they are only activated during business hours. Such systems may define preset temperature levels to prevent individuals from overriding the settings.

One motivation for controlling power loads occurs when the power utility company is not able to fully supply the electrical power demands for all users. This results in 'brownouts' or 'rolling blackouts,' and typically occurs in the summertime during peak usage. From the power utility company's perspective, it is imperative that when the demand exceeds the available power, that loads be controlled. Otherwise, various automatic measures in the power grid will automatically reduce loads to prevent harm to the power grid. This results in an unplanned blackout, which is a total termination of power to selected service areas.

One solution is for the power utility company to selectively terminate power in certain areas ('rolling blackout'). Another solution, which is often preferable, is to lower the load by terminating selected energy intensive loads (e.g., A/C systems). One method of accomplishing this is for the power utility company to telephone selected customers and verbally request deactivation of A/C units at a specified time for a specified duration. Alternatively, the power utility company can request the customer to alter their power consumption in other ways. For example, the power company can request a customers to set A/C thermostats at a higher temperature.

Another method for reducing consumption involves an economic based incentive where usage rates may be increased during peak usage hours (e.g., typically during afternoon business hours). This relies on users to monitor their usage carefully and adjust their power consumption accordingly.

However, these schemes heretofore have relied on manual intervention. While many sophisticated control systems may be deployed to controlling loads, the inability to communicate and readily exchange information has hindered more efficient power load control approaches. The incorporation of IEEE 802.15.4 and IEEE 802.11X-based wireless communications links offers the ability to overcome this problem in a cost effective manner, and allow full integration of remote management capabilities for power load control.

As used herein, 802.11X (upper case 'X') does not specifically refer to a task group within the 802.11 committee structure, nor a specific standard of a task group. While there is a set of capabilities known as 802.11x (lower case 'x'), which focuses on a method for transporting an authentication protocol between the client and access-point devices involving the Transport Layer Security (TLS) protocol, the term 802.11X (upper case) as used herein refers to any of the protocols and procedures associated with the 802.11 wireless communications, including 802.11a, 802.11b, 802.11g and others (including 802.11x) that may be used singularly or in conjunction with each other. Similarly, as used herein, 802.15.4 ("802.15") refers the set of capabilities associated with implementing IEEE 802.15.4 in equipment and includes related standards and capabilities associated to provide communication between entities. This includes, for example, other IEEE standards associated with LAN communications, such as the LLC layer residing over the MAC layer.

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Turning to FIG. 1, this figure illustrates one embodiment of the prior art regarding the use of IEEE 802.11b for wireless data communications involving a personal computer. A personal computer 15 is configured with 802.11b capabilities, either by incorporating an 802.11b accessory board or having the 802.11b capability integrated into the system. The personal computer communicates wirelessly using radio waves 14 with an access point 13. The range of communication is based in part on the power of the radio signal and the data rate, and is typically 100-200 feet, which is an adequate range for many residential applications. The access point 13 is typically connected to a communications network, using devices such as a cable modem 12 (or DSL modem). The cable modem provides high-speed access via a cable facility 11 to the Internet 10. Though illustrated as a single network, the Internet 10 is actually a collection of networks cooperating to form a single logical Internet 10 as is well known to those skilled in the art.

A host processor 6 is illustrated as connected via a communications facility 17 (such as a T1 communications line) to the Internet 10. The communication facility 17 can be any type of the high speed digital facilities commonly used. This architecture allows the user to seamlessly communicate using a TCP/IP connection 16 with the host 6.

Figure 1B:
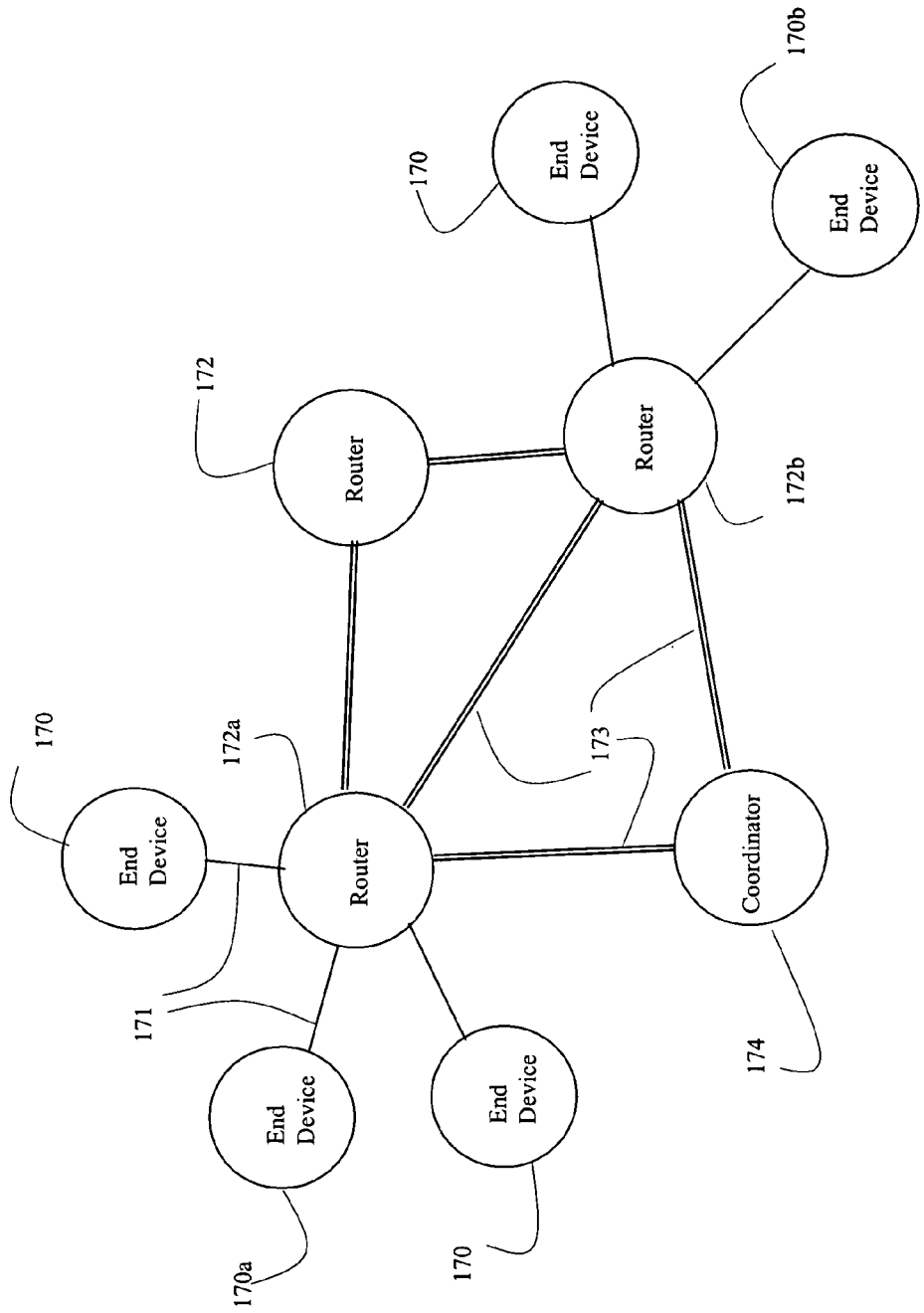

The 802.15.4 provides for full function devices (FFDs) and reduced function devices (RFDs). As shown in FIG. 1*b*, End Devices 170 can communicate in a star network pattern with a router 172. The router functions as any type of network node in that it provides connectivity with other nodes. Both the router and the end device may be integrated into devices, but the end device may optionally be a reduced function node. Routers, are always full function nodes. Thus, even though there is not direct communication between one end device 170*a* and another 170*b*, the two devices can communicate by traversing a series of routers 172*a*, 172*b*. Finally, a coordinator node 174 functions to coordinate the network. In 802.15.4 networks, each router can be deployed in a device that transmits and receives data with the added functionality of relaying data from another router. Thus, a 'mesh' network can be established where each network node not only generates and receives data, but functions to relay data as well from other nodes. The distinction between the network infrastructure and the users of the network is blurred.

Figure 2:
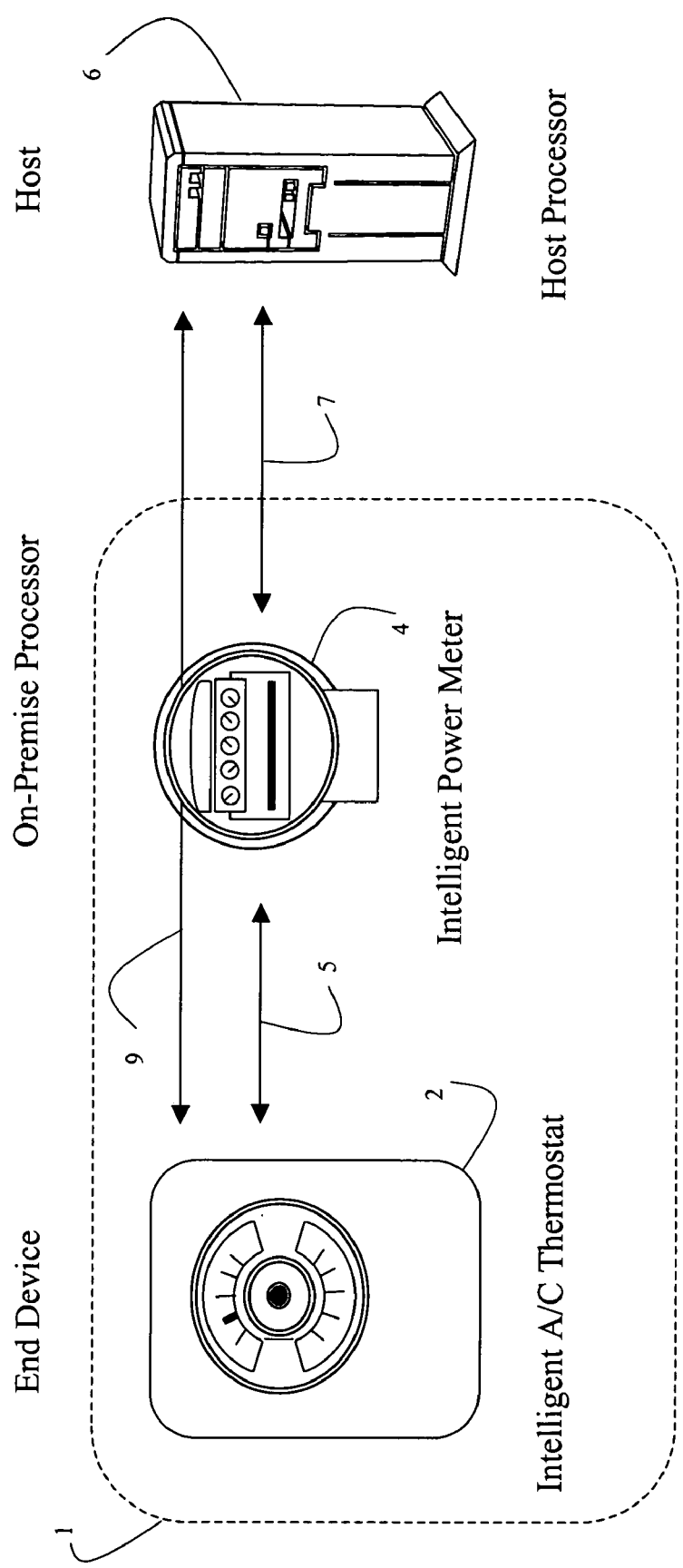
FIG. 2 illustrates one embodiment of the basic architecture for communication involving an end device, a power meter incorporating an integrated on-premise processor, and an energy management host according to the principles of the present invention.

This architecture can be adapted for remote energy management as illustrated in FIG. 2. In FIG. 2, there are three main components in the embodiment illustrated: these are the end device, illustrated as an intelligent air-conditioning (A/C) thermostat 2; an on-premise processor incorporating an on-premise processor and additional functionality, illustrated as an intelligent power meter 4; and an energy management host processor 6.

"End device" as used herein is a generic descriptor for any type of device that initiates and terminates data transmitted to the on-premise processor. As used herein, an "end device" is not limited to the functionality of an end station as defined in the 802.11 architecture, but may incorporate additional functions, including applications for controlling loads, processing energy-related data and so forth. End devices may be embodied in various forms, typically by augmenting a controller of some sort with the capability to transmit and receive information using the appropriate 802.11X-based or 802.15.4 wireless standard. In this illustration, an intelligent A/C thermostat is an end device, and may comprise an A/C thermostat that has been adapted with a processor and programmed for allowing remote load management.

The second main component in the architecture embodied in FIG. 2 is the On-Premise Processor (OPP). As used herein, an OPP may include the capabilities of an access point as defined in the 802.11X-based architecture or incorporate the routing or coordinator functionality of 802.15.4, but the OPP typically includes additional capabilities and functions. An on-premise processor may be simply a relay of information, or the OPP may perform additional processing and control functions. An on-premise processor requires the hardware and software to perform the 802.-wireless related functions, and typically does terminate and process the application layer protocol information. The OPP is typically programmable so that various value-added applications can be implemented by software resident on the OPP or downloaded by the host. The OPP illustrated herein as an 'intelligent power meter' 4 is just one embodiment. Other embodiments may involve an OPP that is internally co-located with the power or other type of meter, externally co-located with the meter, or some other variation.

The third main component in the architecture is the host processor 6. This may be a computer, such as a PC, mini computer, or host server. It incorporates the typical hardware and software associated with a transaction oriented host processor, including a database for retaining addresses and data for numerous distinct and separate power loads. The host processor may be an integral part in controlling the power load, either directly or indirectly, in addition to performing other functions as will be discussed. The details of a host embodiment will be discussed subsequently.

In the embodiment illustrated in FIG. 2, the end device 2 is located in the vicinity of the OPP 4. As illustrated by the dotted line 1, these devices are typically in close proximity of each other, typically within 100-200 feet. The term "on premise processor" reflects one embodiment of having the processor 4 located at the same premises as the end device from the perspective of the host. Thus, the host views the processor 4 as located in the same location or premise as the load. The communication between the end device and OPP is typically via wireless communication 5 at a relatively low power, since typically a short distance is involved. End devices that rely on 802.15.4 are typically required to be within 30 meters (98 feet) from the OPP. However, increase power transmission, using higher frequencies (e.g., the 2.5 Ghz band), and high quality antenna provides a range of up to 300 meters (980 feet). This greater distance is feasible for deployment in a significant number of residential environment. The proximity of the OPP 4 and the host processor 6 is variable, and frequently these can be located in different geographic areas, as in different cities or even states. It is not necessarily the case that the technology used between the end device and OPP is the same technology used as between the OPP and host. The communication link 7 between the OPP 4 and host 6 may be various wireless or wireline based communication facilities, including 802.11X-based wireless technologies. While 802.15.4 may be used, typically the distance from the OPP to the host processor is greater than 300 meters.

The end device can also establish communications 9 with the host on a peer-to-peer basis. However, since the end device utilizes a limited power 802.11X or 802.15.4-based wireless communication capability, the communications link between the end device and host may involve the OPP acting as a relay and/or a protocol converter. Because the radio range of the end device may be limited, the OPP facilitates communication with a distant host. Further, because the host may not implement any form of 802.11X-based wireless communication, the OPP acts to convert the wireless protocol into a protocol format recognized by the host, which may even be wireline based. This allows the host processor to be isolated from the changes in the wireless based technology, and vice versa.

Figure 3A:
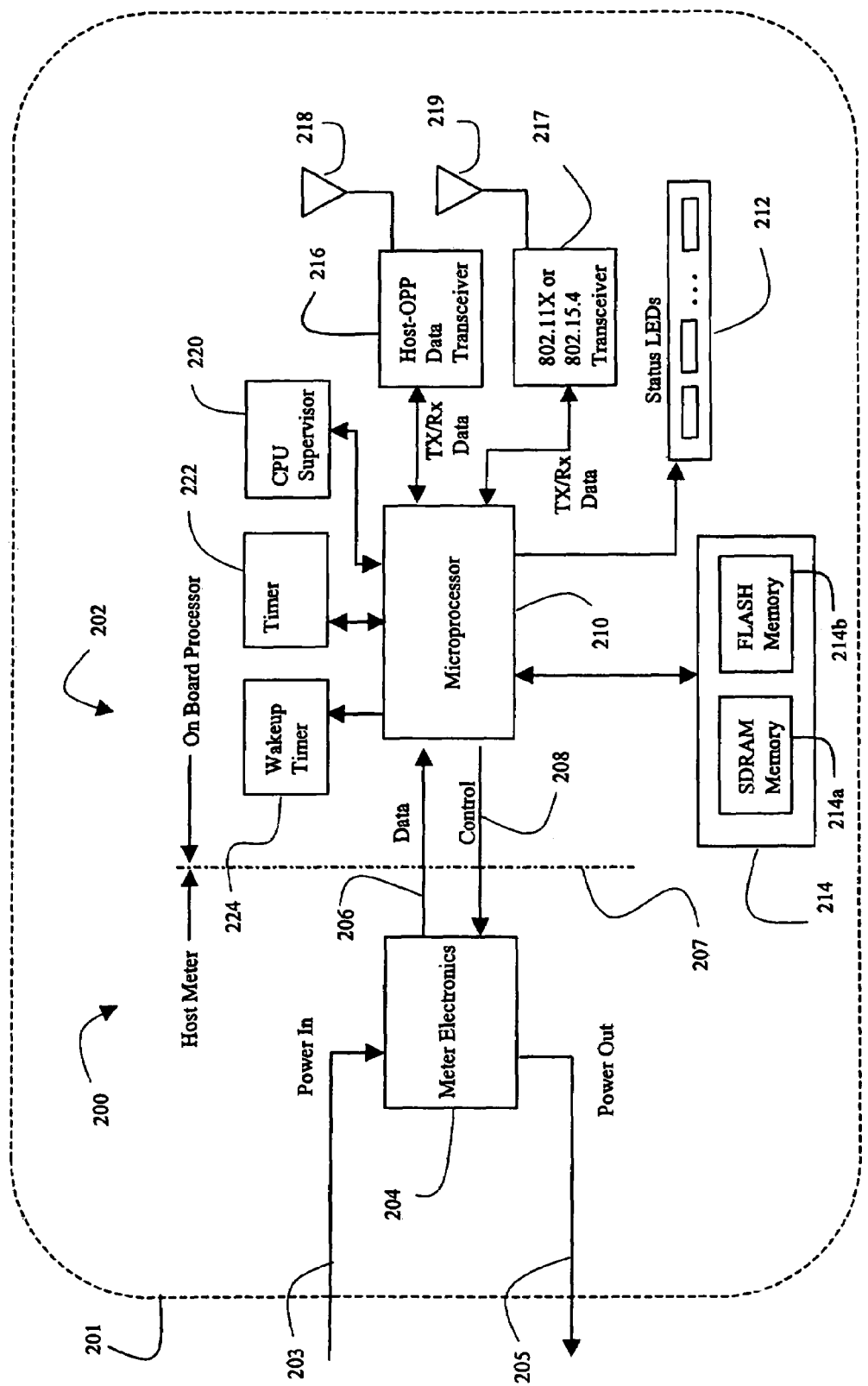
FIG. 3a illustrates one embodiment of a power meter with an integrated processor for energy management.

FIG. 3a illustrates one embodiment of the On Premise Processor 202 that is integrated with a power host meter 200 to form an integrated system 201. In FIG. 3a, the system 201 is depicted as co-located within the glass and metal housing of a power meter. Thus, all the components of the system 201 are typically inaccessible to non-service personnel. Typically, the only connections into/from the system are for providing unmetered power 203 into the system or metered power 205 from the system.

There are two main portions of the system comprising a host power meter 200 and the On Premise Processor 202, which is also referred to as an 'On Board Processor' because the processor is typically co-located with the same circuit board containing components associated with the meter. The OPP may be mounted on the same circuit board containing the other components or may be on a separate circuit board that connects in some manner to another circuit board. The meter portion 200 obtains and retains power related measurements, including usage, status, and power quality measurements. It communicates with the OPP portion 202 via a defined interface 207. Although this may be embodied as a connector, it may also be embodied as a logical interface only. One aspects of the interface is that various types of data 206 are provided from the meter to the OPP and the OPP may issue control commands 208 to the meter, such as providing data requested by a control command.

The OPP is controlled by a processor 210 which can be one of various types of microprocessor or microcontroller chips. The processor 210 typically interacts with memory 214 that includes both volatile 214a and non-volatile memory 214b. The processor also can communicate data to/from the host by using a wireless data transceiver 216 that sending/receiving data using radio waves using an antenna 218. The microprocessor 210 provides visual status indications via various status LEDs 212, which may facilitate diagnosing the status or condition of the system by service personnel. The processor 210 also interacts with various circuits to ensure continuous operation, namely a wakeup timer 224, a timer 222, and a CPU supervisor 220. The wakeup timer 224 ensures that the CPU exits a sleep mode after a reset has occurred. The timer 222 ensures the application executed by the CPU does not 'lock up' in an unknown state. If this occurs, the timer will function as a watchdog timer and reset the CPU. The timer 222 also functions to maintain real time so that elapsed time or current time may be noted by the microprocessor. Finally, the CPU supervisor 220 ensures that when a brownout or reset occurs, the restoral of the CPU occurs in an orderly manner, including that the input voltages are sufficient. The aforementioned system also incorporates a second transceiver 217 that incorporates an 802.15.4 or 802.11X-based protocol(s). This transceiver is used to transmit and receive data, with an end device. The 802.11X or 802.15.4 wireless transmit signal is limited to maximum power by the FCC and has a corresponding range which is typically less than the range of the host-OPP transceiver 216. The transceiver 216 typically uses a regulated frequency spectrum and a different power level. For example, host-OPP wireless communication may use digital cellular, WAP, or a paging protocols. Each of these operates on different frequencies with different operational characteristics.

Figure 3B:
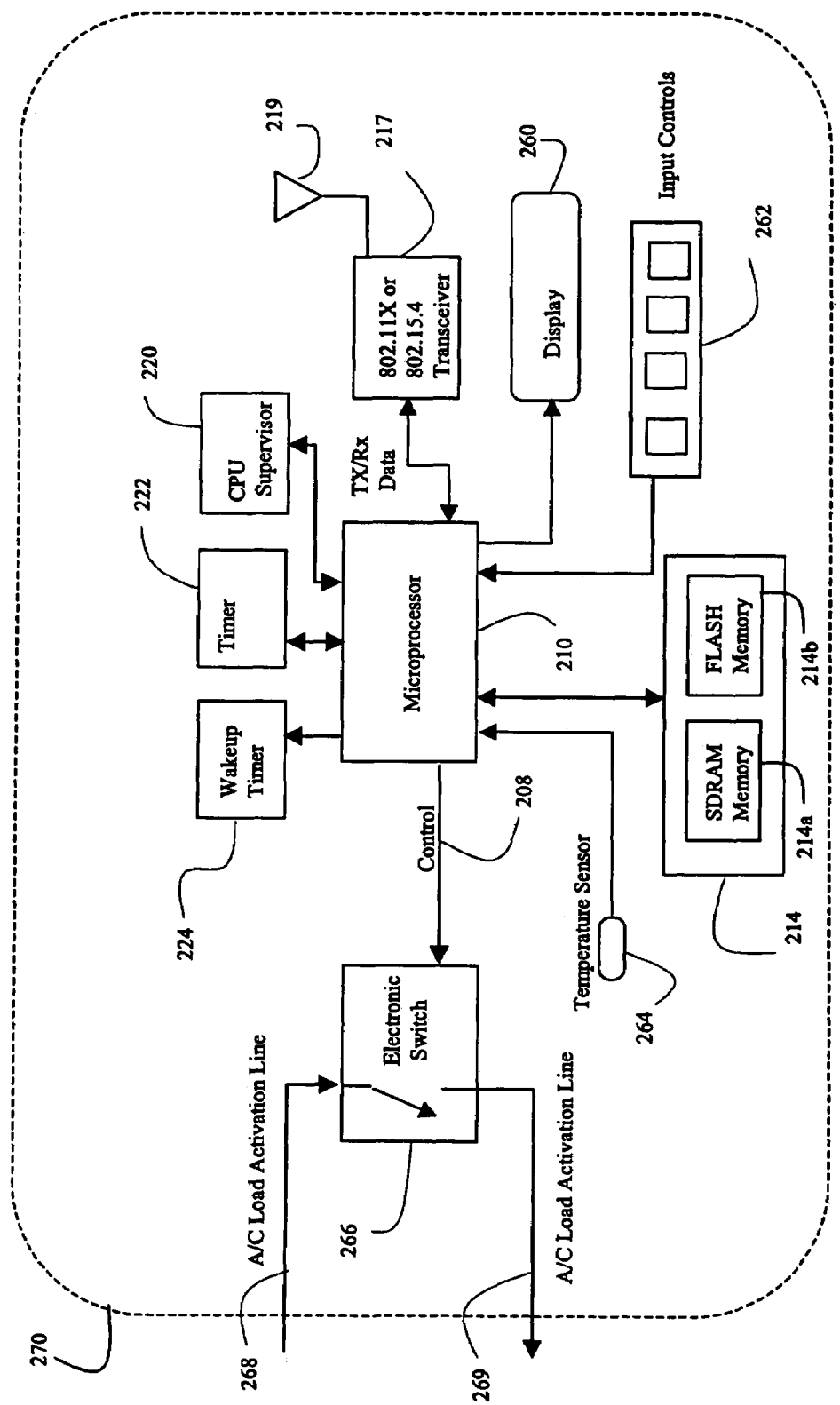
FIG. 3b illustrates one embodiment of an air conditioning thermostat with an integrated processor for energy management.

As the embodiment of FIG. 2 illustrates, the OPP of FIG. 3a may communicate with an intelligent thermostat 2. An embodiment of the intelligent thermostat is illustrated in further detail in FIG. 3b. Some of the components of the intelligent thermostat may be common with the components of the OPP. In FIG. 3b, the intelligent thermostat 270 contains a microprocessor 210 that communicates with memory 214b that may comprise both volatile SDRAM memory 214a and non-volatile FLASH memory 214b. The microprocessor may also be connected to various control circuits, such as the wakeup timer 224, timer 222, and CPU supervisor 220, the functions of which have already been described. The microprocessor 210 interfaces with a 802.11 or 802.15.4 data transceiver 217 that uses an antenna 219 to communicate with the OPP.

The intelligent thermostat typically incorporates a display 260 that indicates the current and desired temperatures and the thermostat incorporates a temperature sensor 264 providing ambient temperature data. The temperature sensor 264 could provide digital values that the microprocessor scales to the appropriate temperature scale, or the temperature sensor may provide an analog voltage input which is converted to an analog to digital (A/D) converter, either incorporated into the microprocessor or by discrete A/D circuitry.

The microprocessor 210 controls an electronic switch 266 via a control interface 208. An alternative embodiment of the switch could be an electromechanical switch, such as a relay. Regardless, the switch 266 completes the circuit for a A/C load activation line so that the input A/C load Activation line 268 is connected to the output A/C load activation line 269. When the connection is completed, the load may be activated. In alternative embodiments, the completion of the connection by the switch 266 may de-activate the load.

FIG. 3b does not illustrate a power source for the various components. The type of power source may depend in part on the type of wireless transceiver used. For example, use of an 802.15.4 wireless transceiver may allow use of a battery for operation in the end device, while use of a battery may not be practical for an 802.11X based transceiver. Use of 802.11X based wireless transceivers may require operation with a power source derived from an external power source. For example, it may be desirable to minimize or avoid user replacement of batteries, which may be more frequent when using an 802.11X based transceiver.

Figures 4A, 4B:
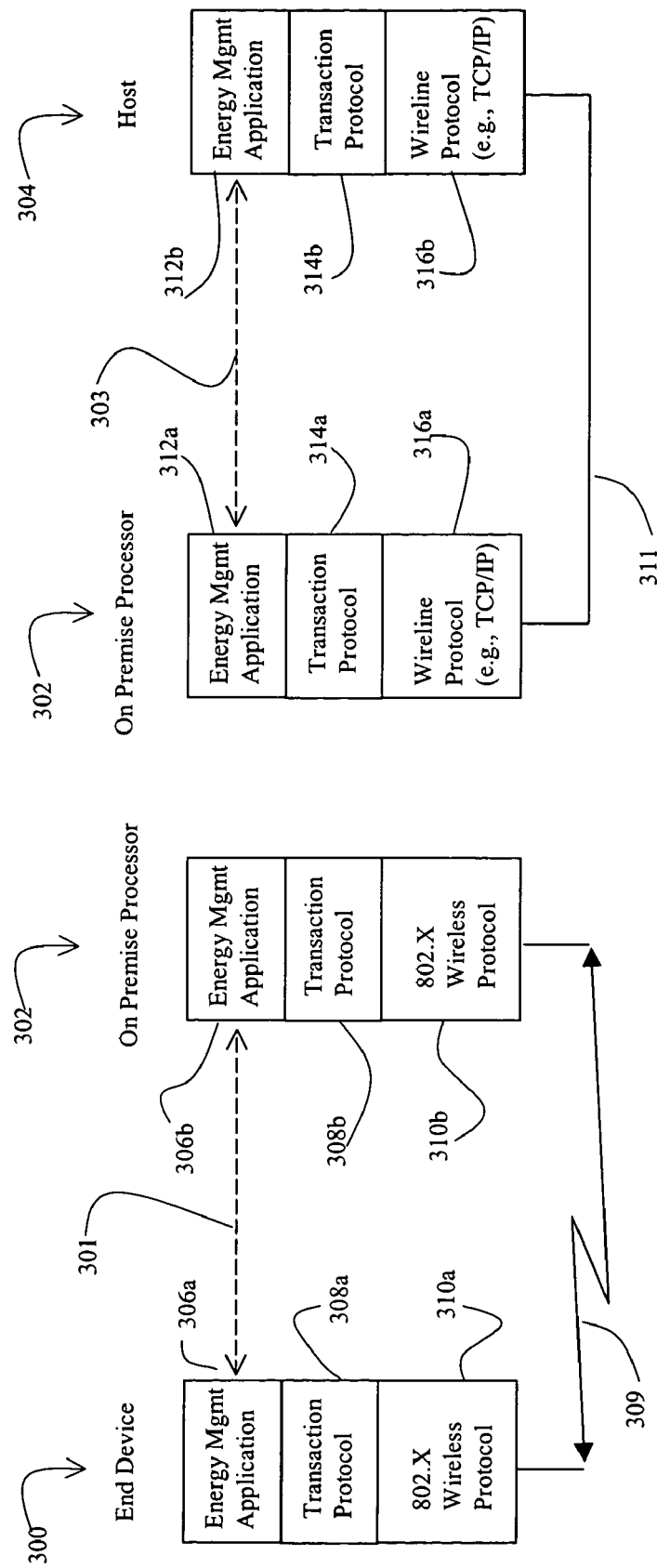
FIG. 4a-4d illustrate various protocol stacks associated with various embodiments of the basic architecture.

FIGS. 4a-4d illustrate embodiments of the protocol stacks that may exist for the various configurations of FIG. 2. A protocol stack is a representation of the protocol layers used to implement communication in a system, and illustrates how communication occurs with other devices at various peer-to-peer levels. Such concepts are well known in the area of data communication and serve in part to model how communication functions are modularized. In FIG. 4a, two protocol stacks are illustrated—the end device protocol stack 300 and the On-Premise Processor protocol stack 302. In this embodiment, each system comprises three protocol layers, though more or less could be used and layers can be frequently viewed as having sublayers defined.

Starting at the top layer, the Energy Management Application 306a resides in the end device and communications with a peer application in the OPP, also an Energy Management Application 306b. Though the applications are peers, this does not necessarily mean that they contain identical functionality, just that they are designed to communicate with each other. For example, the OPP may issue a command to deactivate a load, and the end device will recognize and process the message. It does not necessarily follow that the end device has the capability to issue the same request to the OPP.

The communication between the peer entities is represented by the dotted line 301 between the two protocol stacks. Although not shown, typically similar peer-to-peer communication occurs between the other layers as well. For example, the End Device Energy Management Application 306a typically will request authorization to activate a load. The OPP Energy Management Application 306b is designed to receive such a request and provide a response. Further, the End Device Energy Management Application is designed to understand the response. Such applications may be defined for load management, requesting energy usage information, reporting energy related status conditions or data, and so forth. The communication capability is typically defined for accomplishing a specific application—in this embodiment, it is for energy management, but it could be used for process control systems, alarm conditions, asset tracking, etc.

The Energy Management Application layer 306 uses the services of the transaction protocol layer, 308a, 308b. The transaction protocol layer may be based on the X.408/409 remote operations protocol or any other transaction protocols, such as X.400 message handling, or IP. Other standard or proprietary protocols can be used. The transaction protocol typically conveys simple transactions, comprising a 'request' message and a 'response' message. In addition, some transaction protocols may allow multiple intermediate messages, such as 'continuation' messages. The transaction protocol defines the basic message structure, meaning, and procedures for requesting data and receiving the response. It also incorporates procedures for indicating the presence of errors in messages and requesting retransmission as well as acknowledging receipt of error free messages. It conveys messages defined by the Energy Management Application, so that the transaction protocol could convey requests for energy status and associated responses, or the transaction protocol could convey requests for any other application just as easily. Typically, the transaction protocol in the end device 308a has the same functionality as contained in the transaction protocol in the OPP 308b. Thus, these are typically peers.

Finally, the transaction protocol messages are conveyed using either the IEEE 802.11X or IEEE 802.15.4 wireless protocol 310a, 310b. Even non-802 wireless protocols could be used, such the "Bluetooth" wireless standard. As described in the Background section, 802.11X and 802.15.4 provides a wireless LAN like capability allowing the OPP to readily communicate using radio signals with the end device. The 802 wireless protocols communicate using radio waves in a defined frequency spectrum that are represented as providing connectivity 309 between the two systems.

Because each protocol layer is modular, this facilitates implementation, interoperability, and lowers cost. Thus, implementing such a system can be accomplished by integrating IEEE 802 capabilities and transaction protocol software from different vendors, focusing on the application level functionality.

In FIG. 4b, similar protocol stacks exist for the OPP 302 and the Host 304. The energy management applications in the OPP 312a and the host 312b are not necessarily the same as in FIG. 4a. For example, the applications 312 may define the capability of the host requesting the OPP to poll an end device for energy related status indications. In this case, the host is not directly requesting status indications from the OPP, but requesting the OPP obtain the status indications from other end devices. There is great flexibility in defining the application's capabilities, and the variations of FIGS. 4a-d are not intended to limit the energy management applications.

The transaction protocol layer 314a in the OPP and the host 314b may very well be the same as in the end device, but this is not required. Frequently, the OPP to host interaction may be more sophisticated and require additional transaction capability functions beyond that required for the OPP—end device interaction. It may be that the OPP—host transaction protocol layer is a superset from that implemented for end device-OPP communication.

The lowest level protocol layer in the OPP 316a and the host 316b are typically not the same as between the end device and OPP. The lower protocol layer in the host could be a wireline based protocol 316a, 316b. Examples include power line carrier systems or telephony based protocols. The wireline connectivity is represented by line 311. Alternatively, a wireless protocol could be used, potentially based on, for example, 802.11, cellular, paging, satellite or any other type of wireless communication capable of conveying data.

Again, protocol layers are used to provide modularity, so that a system incorporating OPP-Host communication can be adapted with minimal changes. For example, an OPP-Host communication system incorporating power line carrier lower protocol layers could be adapted to wireless communication by replacing the lower protocol layer without having to reprogram/modify the transaction protocol layer or the application layer. Other implementations may have additional layers, such as a network layer, for providing connections to a plurality of nodes on a network. For example, an OPP may desire to connect to one of several hosts, and this would require an addressing capability that may justify using a network layer protocol. This could be, for example, based on the IP protocol.

Figure 4C:
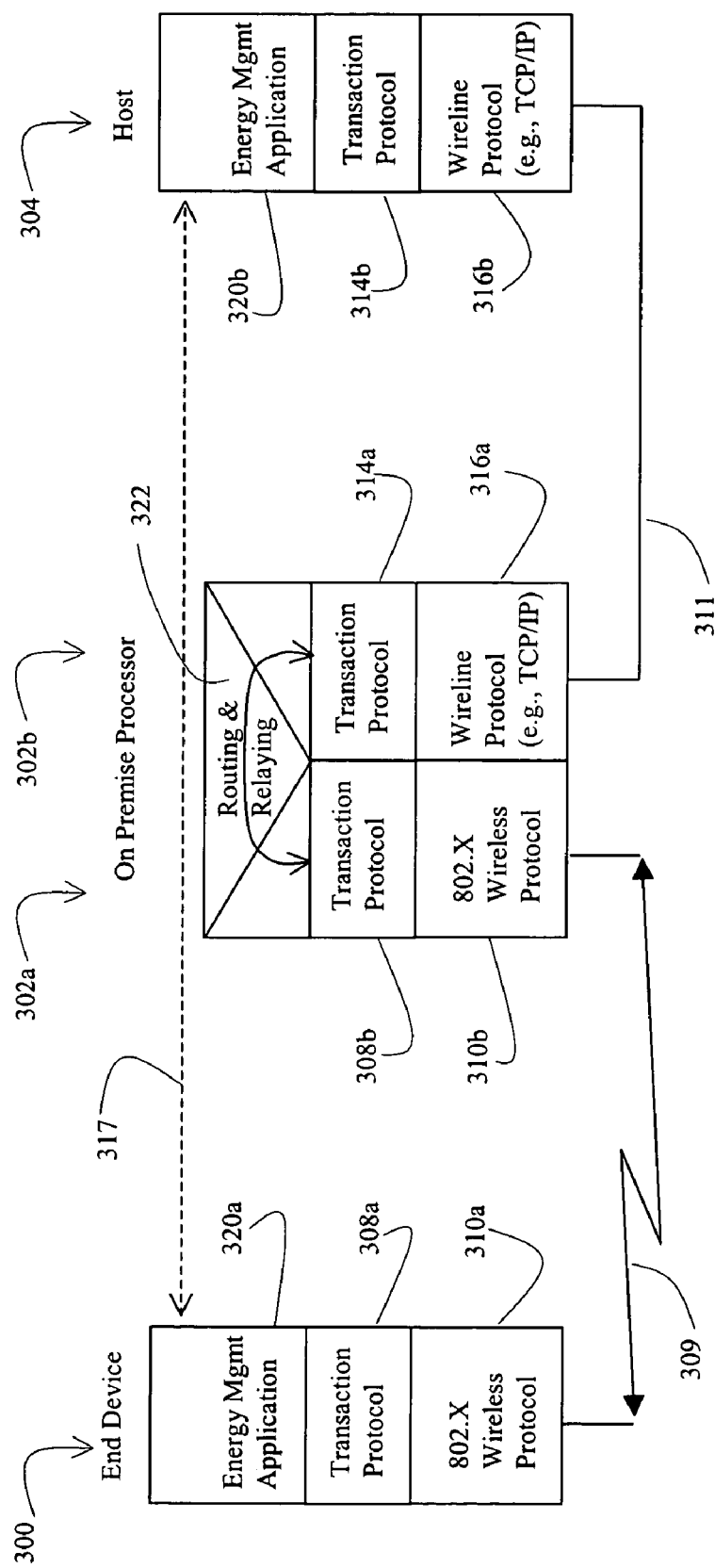

Turning to FIG. 4c, an embodiment of communication between the end device 300 and host 304 is depicted where the OPP protocol stacks 302a, 302b function to relay transaction messages. The OPP protocol stacks 302a, 302b essentially combine the stacks of FIGS. 4a and 4b, with the exception of the energy management application in the OPP. As will be discussed, other embodiments may actually incorporate the energy management applications in the OPP.

In the embodiment of FIG. 4c, the energy management application in the end device 320a communicates with its peer corresponding to the energy management application 320b in the host as represented by dotted line 317. This means that the two protocol layers are peers, and must be designed to be compatible. This architecture has advantages and disadvantages. The advantages include that the application does not have to be deployed by the OPP and the relative simplicity of operation in that the OPP simply relays transaction messages from one side to the other. A disadvantage is that once the end devices are deployed, the corresponding application must be present in the host. This means the host application may be 'frozen' as long as the end devices in the field are supported. This significantly complicates upgrading the host since it is unlikely that all end devices will be upgraded at one time. Thus, the host may be required to support multiple versions of the energy management applications simultaneously.

In FIG. 4c, the end device energy management application 320a uses the transaction protocol layer 308a which in turns uses the 802.11X or 802.15.4-based wireless protocol 310a to communicate using radio waves 309 to the corresponding wireless protocol layer 310b in the OPP, as well as the corresponding transaction protocol layer 308b. The routing and relaying function 322 receives a transaction protocol request on one side 302a of the protocol stack, that is, a protocol request received from the end device, and maps the protocol message to the other transaction protocol request 314a compatible with the host transaction protocol 314b. The information is conveyed from the OPP using a wireline protocol 316a that is conveyed using a physical medium 311 to the corresponding wireline protocol 316b in the host 304. Other embodiments could use other protocols for the lower stacks 316a, 316b.

FIG. 4c indicates that the protocol used to convey information from the end-device to the OPP for the lower layers, may not be the same protocol to convey the information from the OPP to the host. Specifically, the physical medium, protocol layers below the application level messages may be different and mapped as required by the OPP. Alternatively, some or all of the lower layers may be the same, and the OPP simply relays information with a minimal of protocol conversion. Regardless of the particular embodiment used, the energy management application 320a in the end device protocol stack 300 is able to communicate logically 317 with the energy management application 320b protocol layer in the host protocol stack 304. This architecture requires that the two energy management applications in the end device and host are compatible, and this minimizes complexity by minimizing the mapping functions in the OPP. However, if new and advanced energy management applications are deployed with additional messaging functionality, then the host must be upgraded as well. If all the end devices are not upgraded at the same time, then the host must implement multiple versions of the energy management applications and track which version each end device requires. This complicates the operation of the host system as it must maintain and track each version.

Figure 4D:
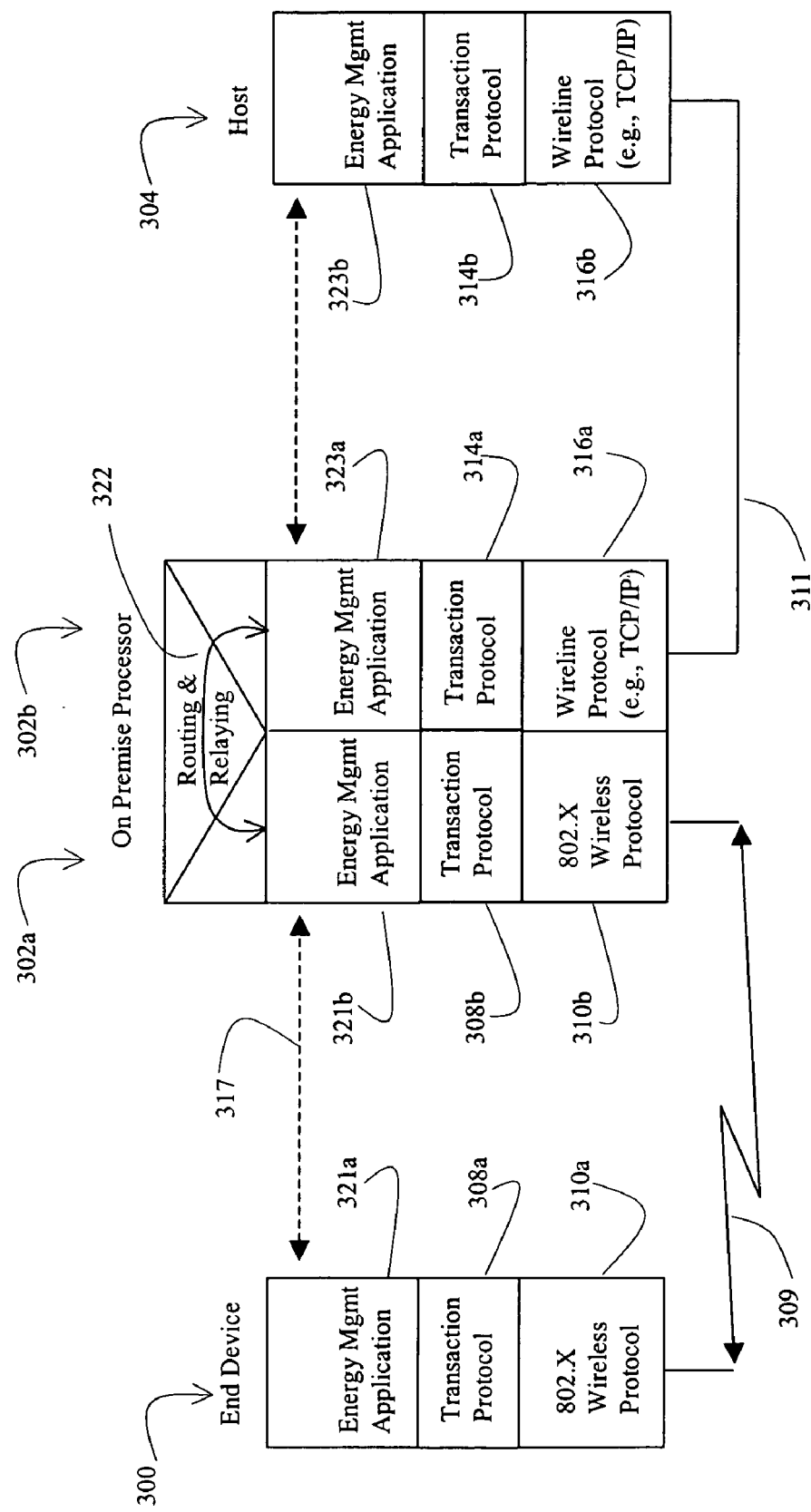

FIG. 4d illustrates another embodiment that alleviates the aforementioned host requirement, but it does involve additional complexity in the OPP. In FIG. 4d, protocol stack 300 for the end device and a protocol stack 304 for the host are present, as well as corresponding protocol stacks 302a, 302b in the OPP for communicating with the end device and host respectively. However, in this embodiment, the energy management application messages are terminated and processed in the OPP. This is indicated by the routing and relaying functions 322 in the OPP occurring above the energy management applications 312b, 323a.

A typical end device—host interaction starts with the end device energy management application 321a initiating a message that is conveyed by the transaction protocol 308a, which in turn is conveyed using a 802.11X or 802.15.4-based 310a wireless protocol. This is wirelessly conveyed using radio waves 309 to the OPP. There, the radio waves are received by the corresponding wireless protocol receiver protocol handler 310b that provides the information to the transaction protocol layer 308b, which in turn, provides the message to the energy management application 321b. At this point, the energy management application processes the energy management message, and determines the appropriate action. In this embodiment, the application determines the message is to be routed and relayed to be communicated to the host. Thus, the application in the OPP is involved in determining how to process the energy management application message. A corresponding energy management application 323a receives the message from the routing and relaying function 322 and formulates a message that is passed down to the transaction protocol layer 314a, which in turn passes it down to the wireline protocol layer 316a, which in this embodiment is a TCP/IP protocol. This is conveyed by a physical medium, such as a cable 311 and received by the host system wireline protocol handler 316b and passed up to the transaction protocol layer 314b, which is turn is passed up to the energy management application 323b.

In this embodiment, the communication 317 from the end device energy management application terminates in the OPP, but the OPP is "intelligent" enough to relay the message using a potentially different energy management application between the OPP and host. The communication between the OPP and host may involve a different application protocol than between the OPP and end device. As long as the OPP can handle the different end device protocols, it is possible for the host to implement only a single energy management application. For example, an OPP maybe deployed that handles two versions of an energy management application that are located in two different types of end devices. The OPP can handle either type of end device, or both, and convert messages from either end device to a single energy management protocol to the host processor. The OPP determines the appropriate protocol to use when communication with the end device based on the address of the end device. Thus, each time a new energy management protocol is introduced into an end-device, the host does not necessarily have to be upgraded, but the OPP must be upgraded. This may occur by downloading additional software to the OPP.

The embodiment of FIGS. 4c and 4d illustrate an end device communicating to the host using a single OPP. As previously noted, the OPP may be embodied by a circuit board integrated into a power meter. This arrangement provides a convenient means for regulating and/or monitoring power consumption for loads attached to the output of the meter. The embodiment of FIGS. 4c and 4d illustrate a single OPP acting to relay information between the end device and the host processor. If all information between the end device and host is funneled through a single OPP, then determination of where information is to be relayed to is straightforward. For example, all communication from end devices received by the OPP is directly routed to a single host. As illustrated in FIG. 4d, the communication between the OPP and the host may occur using the TCP/IP protocol of the Internet. As is well known in the art, a sub-net on the Internet may comprise a series of routing hubs routing information from the originating address to the destination address. Although a single physical connection 311 is shown in FIG. 4d connecting the wireline protocol 316a in the OPP to the wireline protocol handler 316b in the host, there may be a number of relaying Internet nodes involved.

Figure 5:
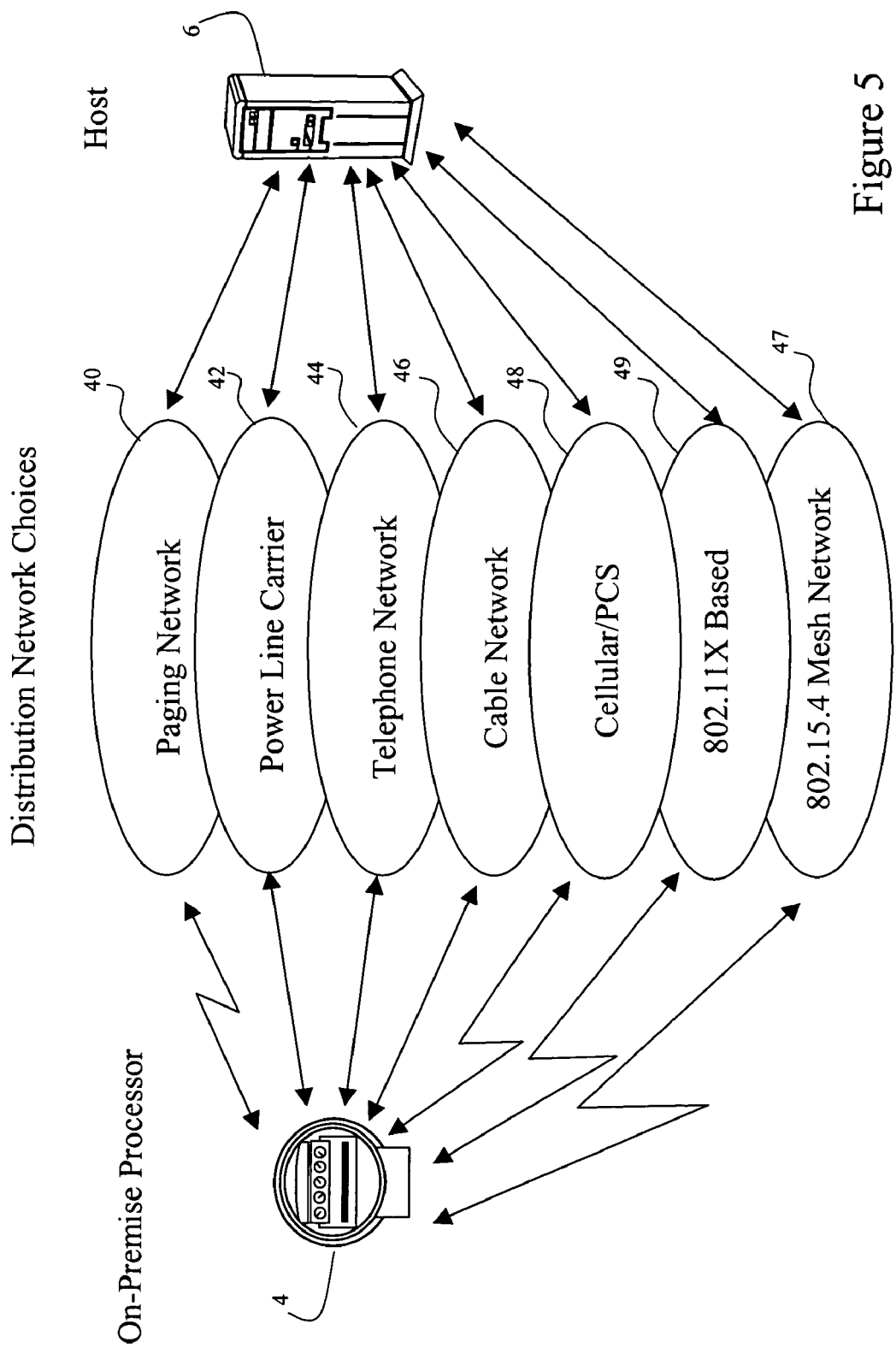
FIG. 5 illustrates various embodiments of distribution networks for facilitating communication between the on-premise processor and a management host according to the principles of the present invention.

Those skilled in the art of data communications will appreciate other variations are possible, and FIG. 5 illustrates other forms of networks that could be used as a distribution network between the OPP and the host. FIG. 5 illustrates the OPP 4 communicating with the host 6 using one or more of distribution networks 40, 42, 44, 46, 47, 48. These are termed 'distribution networks' since the networks may typically be used to facilitate communication of a plurality of OPPs (though only one is illustrated) with a single host. This does not preclude a single OPP from accessing multiple hosts.

The OPP may access a distribution network that is based on a variety of communication technologies. For example, a paging network 40 may be used to communicate information between the OPP and a host. Such technology has been developed and uses a two-way paging capability to send ASCII based messages between a power meter and host processor. The paging infrastructure is well known in the art, and provides low bandwidth data transfer to a large number of widely distributed paging terminals. This distribution network requires compliance with the appropriate FCC regulations regarding transmission of information in the specific frequency band.

The OPP 4 alternatively can communicate to the host computer using a power line carrier network 42. This network provides communication using the power line infrastructure as the physical medium for transferring data using a high frequency carrier signal. Although various limitations may be present due to various power components affecting the signal, this network is well known in the art as well. This network also has the advantage that every residential and commercial location with power from a power utility has connectivity via the power distribution network. Thus, the power distribution infrastructure itself can be used to convey power load management information.

The OPP 4 could also use the telephone network 44 to convey information to a host, using well-known modems for data transfer. Typically, a bandwidth of 56 kps is available using low cost modem technologies that are well known in the art. Typically, locations having access to power service also have access to telephone service, though the power meter may not necessarily be conveniently located to the appropriate telephone line.

The OPP 4 could also the use cable network 46 to convey information to the host 6. The cable network is frequently available in urban residential locations. The OPP may access the cable network by having a physical connection to the cable network or communicate using 802.11X 49 or 802.15.4-based wireless protocols to a cable set top box interworking data to an IP service provided on cable, typically using an industry standard cable modem standard (e.g., DOCSIS). Further, the OPP may utilize a 802.15.4. mesh network 47 in which various other end devices function as network nodes to relay information to the host (see below).

Finally, the OPP 4 could access the host 6 using a cellular/PCS network 48. These wireless networks are also fairly ubiquitous. While providing voice service, they have been adapted to provide data transfer, e.g., via GPRS protocols, EDGE protocols, Short Messaging Service, cellular data modems, etc. The use of wireless cellular/PCS capabilities requires an appropriate transceiver integrated into the OPP, and requires appropriate FCC regulatory approval.

Each of the above schemes has relative advantages and disadvantages. For example, some schemes require regulatory approval or equipment certification (e.g., transmitting on a specified radio frequency) and require that the equipment be certified for use on that frequency. Other schemes may require local wiring, for example physical connection of a phone line or cable line to the OPP. This may increase installation costs as the access from the telephone line or cable drop may not always be nearby to the power meter. Further, not all types of distribution networks may be available in the desired service area (e.g., cable service may not be available in rural or industrial areas). Finally, certain schemes may be more operationally difficult to install or maintain.

Figure 6:
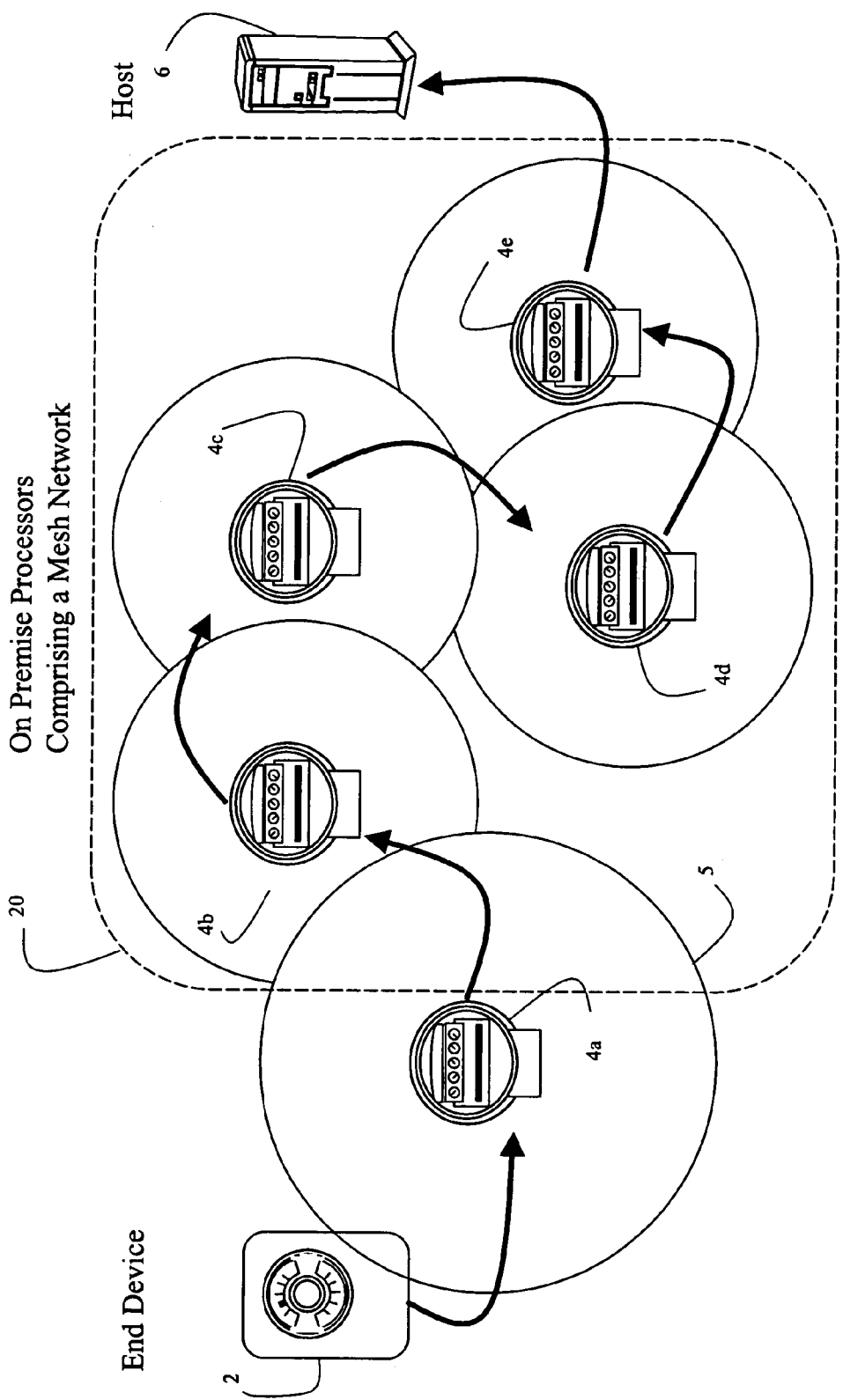
FIG. 6 illustrates one embodiment of a distribution network comprising a mesh network of on-premise processors embodied in power meters according to the principles of the present invention.

Another embodiment of a distribution network is shown in FIG. 6. In this embodiment, the OPP devices themselves function as relaying nodes and form what is referred to as a mesh network. The OPPs can communicate using TCP/IP high layer protocols typically using an 802.15.4 based wireless protocol, which is designed to convey TCP/IP. In FIG. 6, an end device 2 is communicating with the ultimate destination, the host 6. The grouping of intermediate OPPs function as network routing and relaying devices is known as a 'mesh network' 20. The OPPs in the mesh network 20 function as network nodes or routers in this application, not as OPPs 4*a* communicating with an end device. On the other hand, OPP 4*a* functions as an OPP communicating with an end device. The mesh network comprises a plurality of OPPs 4*b*-4*e* communicating with each other through a series of limited distance hops in order to reach the host. This architecture is known to those familiar with IEEE 802.15.4.

In this particular embodiment, the end device 2 is within the transmission range of an OPP 4*a*. The transmission range is illustrated for the OPP 4*a* using a circle 5. This represents the range of the OPP for a given transmitter power level. Thus, if an end-device is transmitting within the range 5 of the OPP 4*a*, then the end device will be able to communicate with the OPP, and vice versa.

The end device is illustrated as just within the range 5 of the OPP 4*a*. In turn, OPP 4*a* is able to communicate to OPP 4*b* since they are within communication range of each other, which in turn is able to communicate to OPP 4*c*, then to another OPP 4*d*, then to another OPP 4*e*, then in turn, finally to the host 6. The mesh network can be modeled in a number of ways from a protocol layering perspective. For example, the mesh network 20 may function in the aggregate as the single OPP comprising the protocol stack 302*a*, 302*b* of FIG. 4*c* in which application information is transparently passed between the end device and host. Alternatively, the mesh network 20 may function in the aggregate as the single OPP comprising the protocol stack 302*a*, 302*b* of FIG. 4*d* where the application level messages are processed. Further combinations are possible. For example, as embodied in FIG. 6, a select number of OPPs 4*b*-4*e* may serve as a network to OPP 4*a*. Thus, OPP 4*a* communicates directly to the host using the other OPPs as a network service provider (e.g., a subnet of the Internet).

This scheme requires less regulatory compliance compared to other forms of wireless transmission since the 802.-based suite of protocols operate in the unlicensed frequency band. However, FCC regulations still require transmission within certain power levels. The typical range of such units is flexible and depends on the power levels and transmission bandwidth. As the number of OPPs (known as routing nodes in 802.15.4) are deployed, the average distance to the nearest OPP decreases and the required power levels can be decreased.

Figure 7:
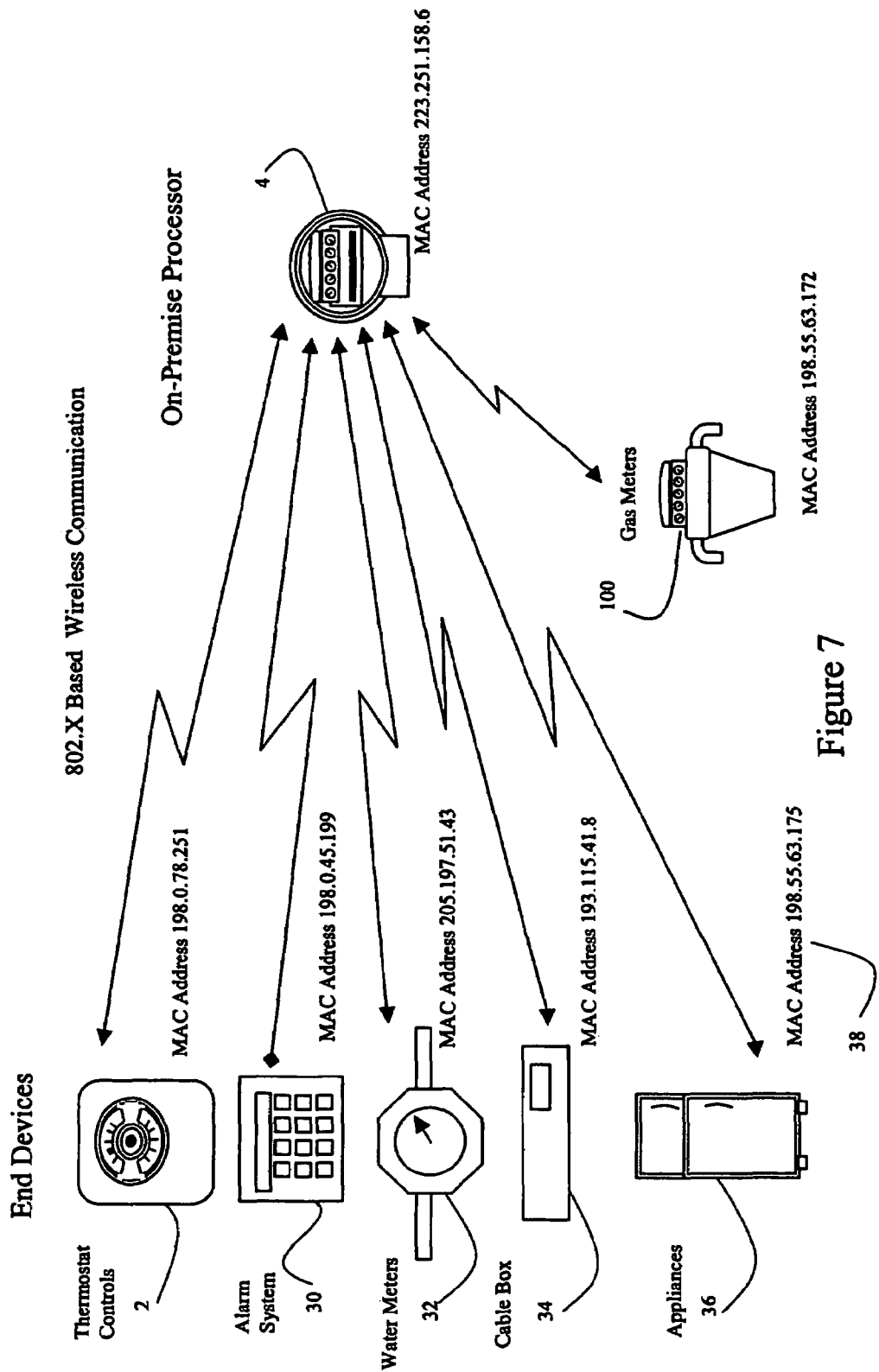
FIG. 7 illustrates various embodiments of end devices communicating with a on-premise processor according to the principles of the present invention.

Typically, the TCP/IP protocol is used for addressing messages between the various elements. The 802based suite of protocols uses TCP/IP and incorporates the well-known IP addressing scheme using MAC (media access control) addresses. MAC addresses uniquely identify a node on a LAN, and FIG. 7 illustrates how various types of end devices can communicate with the OPP. In FIG. 7, each of the end devices is assigned a MAC address. This address can be programmed into the device at manufacturer, or dynamically assigned. In FIG. 7, the end devices represent typical control devices communicating with the OPP, including a thermostat control 2, an alarm system 30, a water meter 32, a cable set top box 34, an appliance 36, and a gas meter 100. Each end device communicates using a wireless 802 based protocol to the OPP 4, which is illustrated as co-located with the power meter. The power meter is usually affixed to the exterior of a residence or commercial building, and the end devices are typically within the range of the OPP 4 located at the same premise. Typically, the distance between the end device and OPP less than 100 feet. Because it is possible that there may be several OPPs co-located into power meters within the range of transmission of the end-device and OPP, a scheme for registering the end-device is required. This could involve remotely programming the OPP with the appropriate address for each end device, or using an auto-registration procedure where a defined time period is established both in the OPP and the end-device to send/receive and register address information. Alternatively, each end-device could be locally programmed to enter the address of the OPP. Such mechanisms are indicated in 802 standards specifications.

Figure 8:
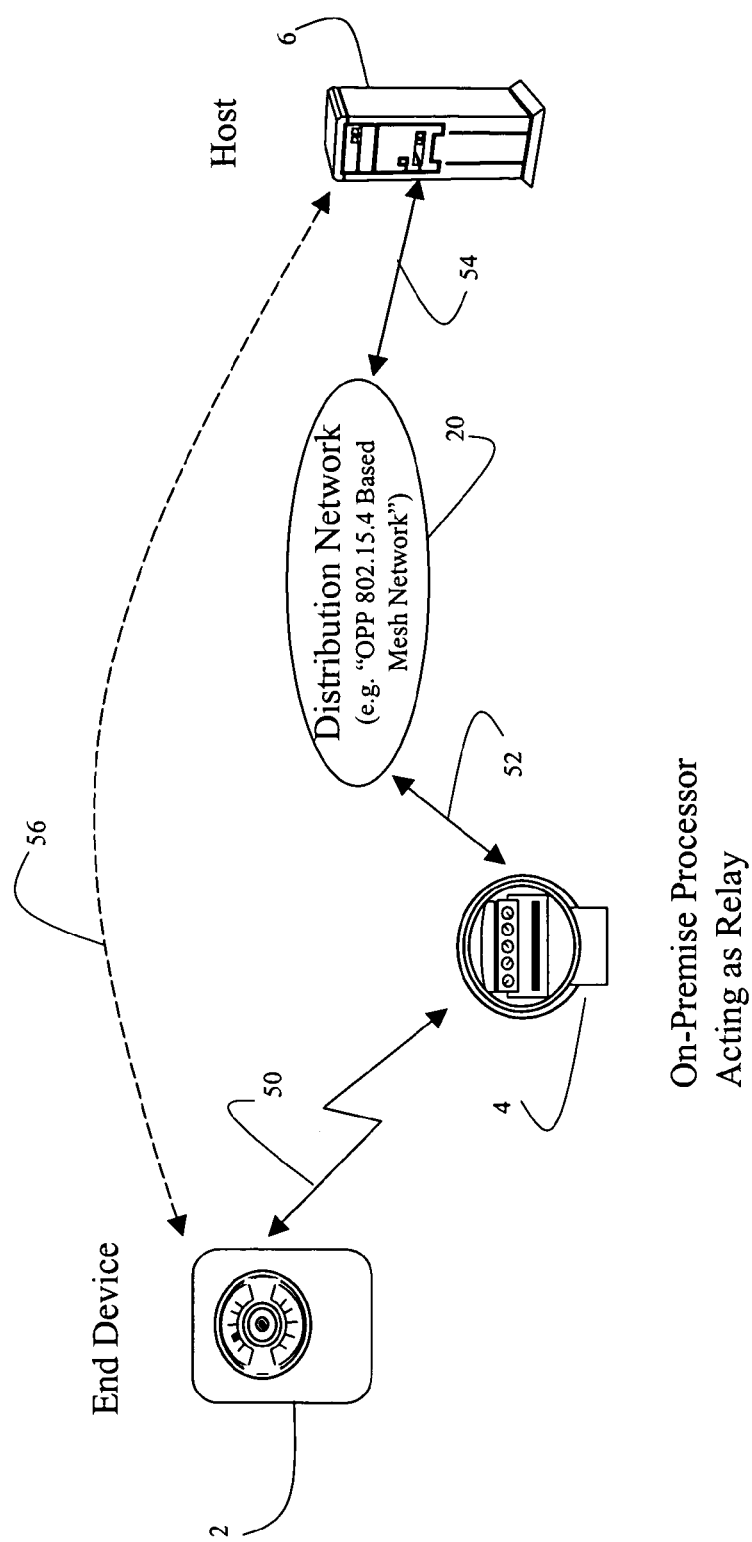
FIG. 8 illustrates one embodiment of energy management according to the principles of the present invention.

FIG. 8 summarizes several of the inventive aspects of the aforementioned discussion in light of an energy management application. In FIG. 8, an end device 2 recognizes the presence of a nearby OPP 4 functioning as a relay of information allowing the energy management application in the end device have peer-to-peer communication 56 with the energy management application in the host 6. The OPP 4 relays information using a distribution network, which can be any of the aforementioned distribution networks, including an 802.15.4 mesh network 20 based on a network of OPPs. s The mesh network 20 has connectivity with the host 6 via a connection 54. It is possible that the 'last' OPP in the mesh network is actually hardwired via a connection 54 to the host via a wireline communication facility (e.g., T1 connection).

Figure 9:
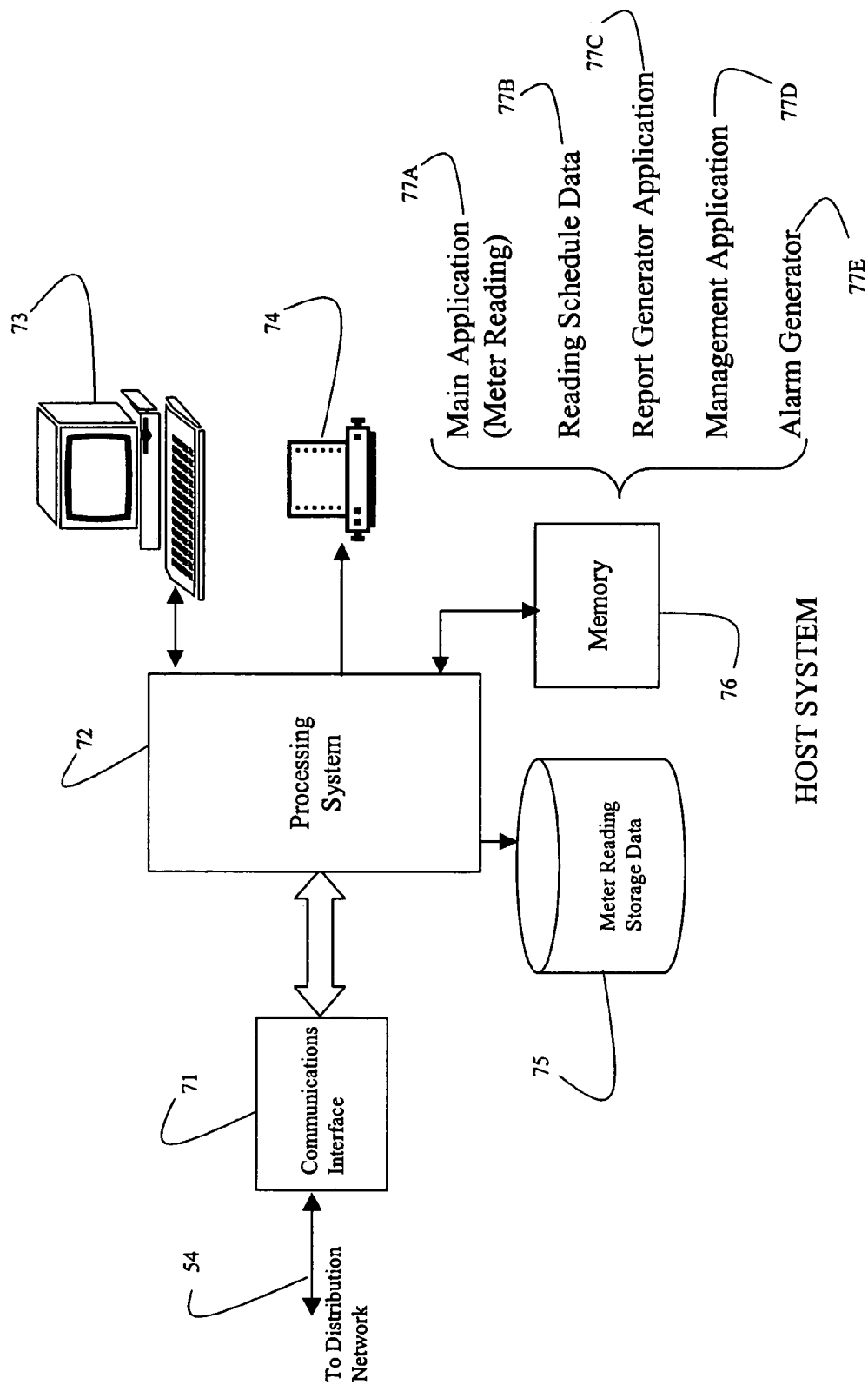
FIG. 9 illustrates one embodiment of an architecture of the host system according to the principles of the present invention.

The energy management host computer 6 is further defined in FIG. 9. In FIG. 9, the energy management host comprises various processing related components. The processing system 72 is typically a large-scale server capable of processing simultaneous communication with numerous remote end devices. An operator console 73 allows administration of the various end-device accounts, including creating, editing, and deleting accounts, and other operational related functions. Various system status indicators can be provided on the operator console 73 as well as the printer 74. The printer is typically used to print out period reports. The processing system 72 also accesses memory 76 used to store various data and application programs. This includes: the main energy management application, including a meter reading application 77a, data pertaining to when each meter is read (typically based on the customer's billing cycle) 77b, the report generator application which takes the meter reading data and aggregates it into the desired form 77c, an account management application 77d allowing new accounts to be established or edited, and an alarm generator 77e used to indicate an abnormal status. Although other applications and data may be present, these illustrate several aspects of a typical energy management application.

The processing system 72 is also connected to a communication interface 71, which in turn connects to the distribution network 54. Since a variety of distribution network technologies may be used, the communication interface 71 allows the remainder of the host processing system, namely processing system 72, to be independent of the particular distribution network used.

The processing system 72 also accesses a database 75 for storing meter-reading data. Typically, meter-reading data are stored on a historical and present basis. Historical data may be stored in a separate database with slower performance requirements. Present data is typically accessible on a real time basis, since information of current usage is typically compared with recent past usage in previous years. Thus, the storage and reliability requirements may be different.

Figure 10:
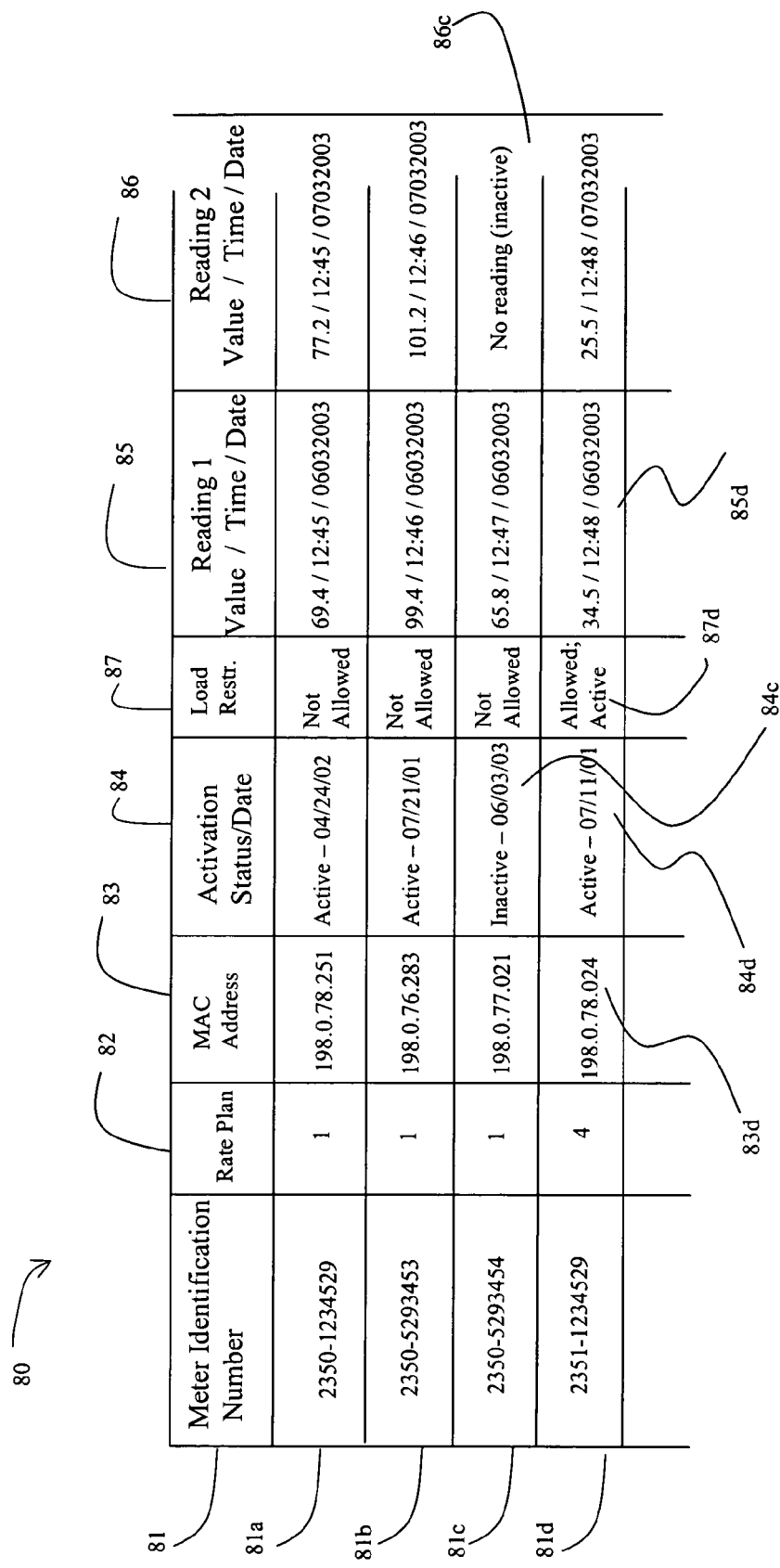
FIG. 10 illustrates one embodiment of a data structure for maintaining meter data in the host according to the principles of the present invention.

A typical record format 80 stored in the database 75 is illustrated in FIG. 10. In FIG. 10, a meter identification number in the column header 81 is used to identify a particular meter's data. In this embodiment, four separate meters 84a-84d are shown, though typically data for thousands of meters are stored. Typically, the meter numbers are determined by the energy service provider or meter manufacturer, and may not necessarily identify the customer's account. The next column 82 identifies the customer account's rate plan, which indicates how bills are calculated based on usage. Typically, additional rating plan data is accessed based on the plan identifier. Next a MAC address 83 indicates the necessary address used to communicate with the particular meter. It is possible that other address schemes could be used. The next column 84 indicates the activation status and date for that meter. The host records the status as to whether a meter is active or inactive. For example, a meter may be 'shut off' to disconnect power when a residence is vacated. In this case, the meter would be labeled as 'inactive' and the date (and possibly time) of the event could be recorded. Specifically, meter identification number 2350-529345 81c is indicated as inactive as of 6/3/03 (Jun. 3, 2003) 84c. The next meter account 84d is indicated active as of 7/11/01 (Jul. 11, 2001).

The host may maintain in each record a load restriction status 87. This field indicates whether the customer is participating in a load reduction program. Specifically, if 'allowed', the customer is willing to receive and act upon a load reduction request in exchange, potentially, for a favorable billing rate. In FIG. 10, one account has indicated 87d participation in load reduction. Further, the indication is listing as 'pending' 87d indicating that load reduction procedures are currently active for that account. The host may maintain information regarding typical load reduction amounts for each customer, and use that is determining an aggregate running load reduction when a load reduction initiative is pending. Thus, a host may issue load reduction requests until a threshold of aggregate load reduction level have been met, at which point the host may not longer issue such requests. Further, the host may prioritize certain customers based on load size or other factors. Although not illustrated in FIG. 10, the host may maintain records (e.g., another column indicating) for each customer participating in the load reduction program if the customer was sent a request and subsequently rejected by the customer. In other words, the customer received the request to reduce their load and chose not to reduce their load. The host may 'flag' such customers for not participating in load reduction so that any predefined economic penalties can be calculated.

Also included for each meter are various meter-reading data. For example, column 85 indicates the first reading, and the next column 86 indicates the next meter reading, and so on. Typically, a finite time period of data is retained (e.g., the 12-24 months) in the present database. For example, the meter of row 81d has an initial reading of 34.5 units measured at 12:48 p.m. on Jun. 3, 2003 85d. The meter reading data typically includes the current reading and the time and date the reading occurred. Other variations on the data structure are possible. Although the embodiment of FIG. 10 illustrates metering reading data as usage related data, 'meter reading data' as used herein can refer to any type of data collected from a meter, and is not limited to only usage data, but can refer to status, time, and any other type of data measurements retained in the meter, including power quality aspects, low voltage indications, frequency variations, etc. Those skilled in the art will recognize a variety of parameters that can be read, stored, and transmitted to a host.

Now that the communications architecture and host processing system have been discussed, various energy management applications are presented. One such application is the limiting of power consumption by major power loads. Typically the power utility companies maintain a list of large power consumption users. If power consumption within a region reaches a threshold, the power utility will typically telephone these customers and request that they voluntarily lower their power consumption. This typically occurs by the customer voluntarily turning off loads, such as air conditioning systems, for a limited time.

Power companies may offer reduced rates to customers if customers voluntarily reduce their consumption when requested. The procedures for reducing power consumption is largely a manual process, and automated procedures using the aforementioned architecture would facilitate such situations.

Figure 11:
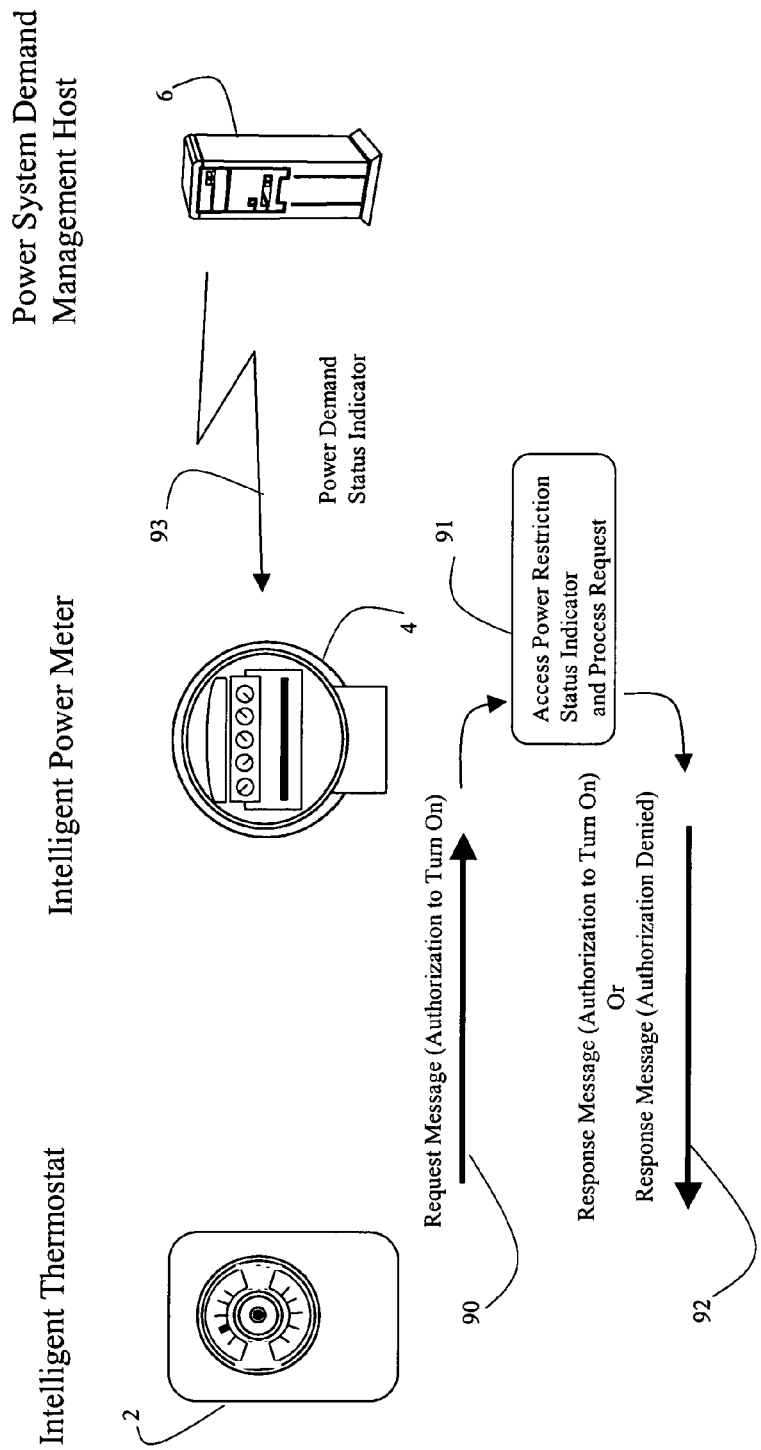
FIG. 11 illustrates one embodiment of an energy load control application according to the principles of the present invention.

In FIG. 11, a system for automating such requests for power reduction is illustrated. A host system 6 manages the power system demand. The host 6 receives various real-time inputs (not shown) of current power consumption in various serving areas associated with the power grid. The host also employs an energy management application determining when a load threshold has been reached, warranting the indication of an alarm requiring the voluntary reduction in power from various customer loads. The host typically maintains a database of all the customer energy loads, including their load characteristics, their relationship to the power distribution grid, and associated contact related information. Typically, the host initially identifies customer loads for energy management. For example, power loads may represent critical applications where power cannot be reduced (e.g., hospitals, emergency responders, etc.) and are not suitable for energy management.

When the circumstances require, the host 6 issues a 'power demand status' indicator 93 that is communicated to a target OPP 4. The communication may occur using a variety of the distribution networks identified, such as the aforementioned paging network, and using either standard or proprietary signaling. The message is sent from the host to the OPP and terminated at the OPP. The message 93 may include a time duration indicating a default duration or requested time duration (e.g., four hours) that the power restriction procedures are in place. The OPP has a timer so that the appropriate amount of time can be determined. Alternatively or in addition, a follow up message terminating the power restrictions can be issued by the host. The recording of the status indication as well as each customer's response can be incorporated into each embodiment, but is only illustrated in this embodiment for brevity. In this embodiment, the OPP is integrated into the power meter and is able to control the flow of power as required in various applications. The 'power demand status' indicates the presence of a 'high power demand' condition. This is triggered when power demand is, or is projected to, exceed a pre-set threshold. The receipt of this message by the OPP in this embodiment does not result in termination of power by the power meter. Rather, the OPP simply records this status in order to respond to a request from a load controller for permission to activate a load. Similarly, the host can reset the power demand status (indicating the absence of a 'high power demand' condition) by sending a subsequent message altering the status indicated.

The 'power load' in FIG. 11 is represented by the intelligent thermostat control 2. In practice, the intelligent thermostat 2 is the controller of an air conditioning system, and the actual load is the motor running the compressor in the A/C unit. However, since the intelligent thermostat controller activates the A/C unit, the controller is used to represent the power load.

Whenever the intelligent thermostat 2 determines that load activation is appropriate, it will first initiate a "request message" 90 to the OPP requesting authorization to turn on. Since the intelligent thermostat does not know the power demand status, it must first check with the OPP. The OPP 4 receives the request and reads the current power demand status indication that it previously received from the host, which is stored in non-volatile memory. The OPP processes the request 91 and responds to the controller with a "response message" 92. The "response message" may indicate authorization or denial to activate the load.

This energy management communication architecture supports two different energy management schemes. In the first scheme, the OPP has absolute control over whether the intelligent thermostat can activate its load or not. The "response message" directly controls the operation of the end device. In some scenarios, this type of energy management may be desirable. However, there are numerous applications in which the customer would like to chose whether they would voluntarily comply with the request to lower power consumption or not. In this second architecture, the 'response message' indicating authorization or denial to activate a load is only an advisory indication from the OPP. The intelligent thermostat after becoming aware of the status, then determines on its own whether to activate the load or not. This allows the customer to have final control over any voluntary reduction of load consumption.

The architecture presented in FIG. 11 is characterized by: information being transferred between the host and the OPP, the OPP processing and storing the information, and the OPP subsequently interacting with the end device. The architecture also presumes that the intelligent thermostat will query the OPP prior to each activation. This may result in unnecessary requests communicated to the OPP, particularly during a time when there are no power restrictions (e.g., during the winter time). Those skilled in the art will recognize that additional messages may be defined to improve the messaging efficiency. For example, many power load problems occur in the summer months when A/C usage is at a peak. A host processor can often predict when power load restrictions are required (e.g., comparing recent usage and forecasted temperatures). The power system host can issue a command to the OPP requesting the OPP to indicate to the end-devices that the end devices should request authorization before activation until notified otherwise. In this manner, a host can predict for a given day the possibility of restrictions and notify the OPPs to notify the end devices that load activation requests should occur. This allows 'deactivating' the energy management system as needed (e.g., during winter) and 'reactivating' the system when required (e.g., during summer).

Another variation of the previous control architecture involves the end device querying the OPP prior to load activation, but the OPP defaults to authorizing activation unless a power restriction indication has been received from the host. If a power restriction indication was received, the OPP will initiate a query to the host indicating the particular end device that is requesting load activation. The host response is received and relayed by the OPP to the end device. In this manner, the host is not burdened with handling load activation request until the host first notifies the OPP. However, the OPP is burdened with processing messages from the end device. Similarly, once conditions warrant, the host can indicate the absence of a power restriction to the OPP, where after the OPP defaults to approving load requests from the end device.

Figure 12:
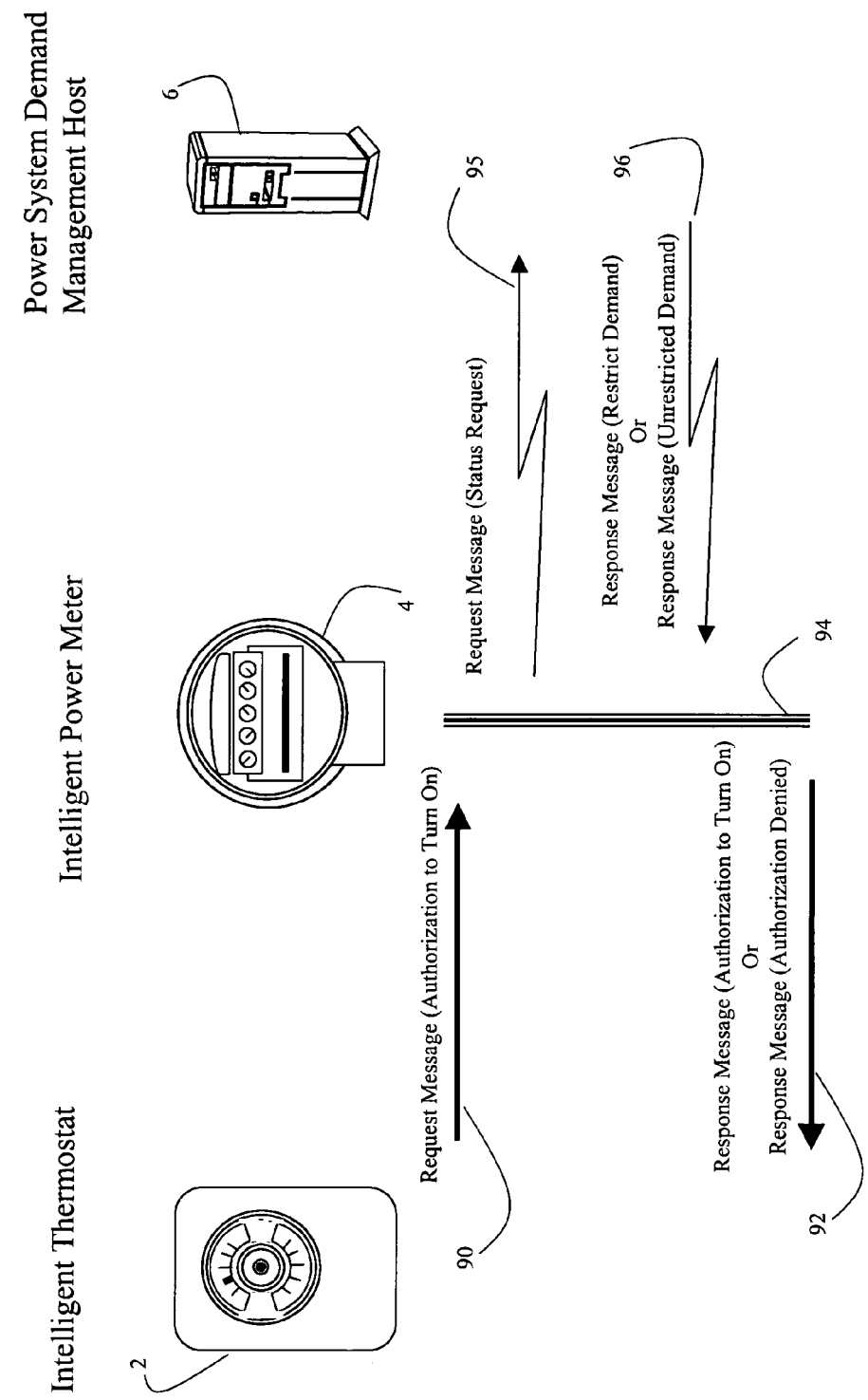
FIG. 12 illustrates another embodiment of an energy load control application according to the principles of the present invention.

FIG. 12 embodies another variation of managing power consumption in a power load. In FIG. 12, the intelligent thermostat 2 again initiates a 'request message' 90 to the OPP. The OPP 4 recognizes the request message requires determination of the power demand status, and in response generates a query to the host 6. The query message is a "request message" 95 requesting the current power demand status. The host receives the message, and based on determination of the power demand status, the host responds with a 'response message' 96 that is sent to the OPP. The OPP recognizing that a pending response the end device is required, generates a 'response message' 92 with the appropriate authorization or denial.

Whereas the OPP in FIG. 11 processes requests from the end device autonomously, the OPP in FIG. 12 processes each request from the end device by relaying a corresponding message to the host. In this architecture, the OPP terminates messages from the end device, and initiates a separate message to the host. Thus, there is a "firewall" 94 created by the application in the OPP between messages from the end device and messages to the host.

Figure 13:
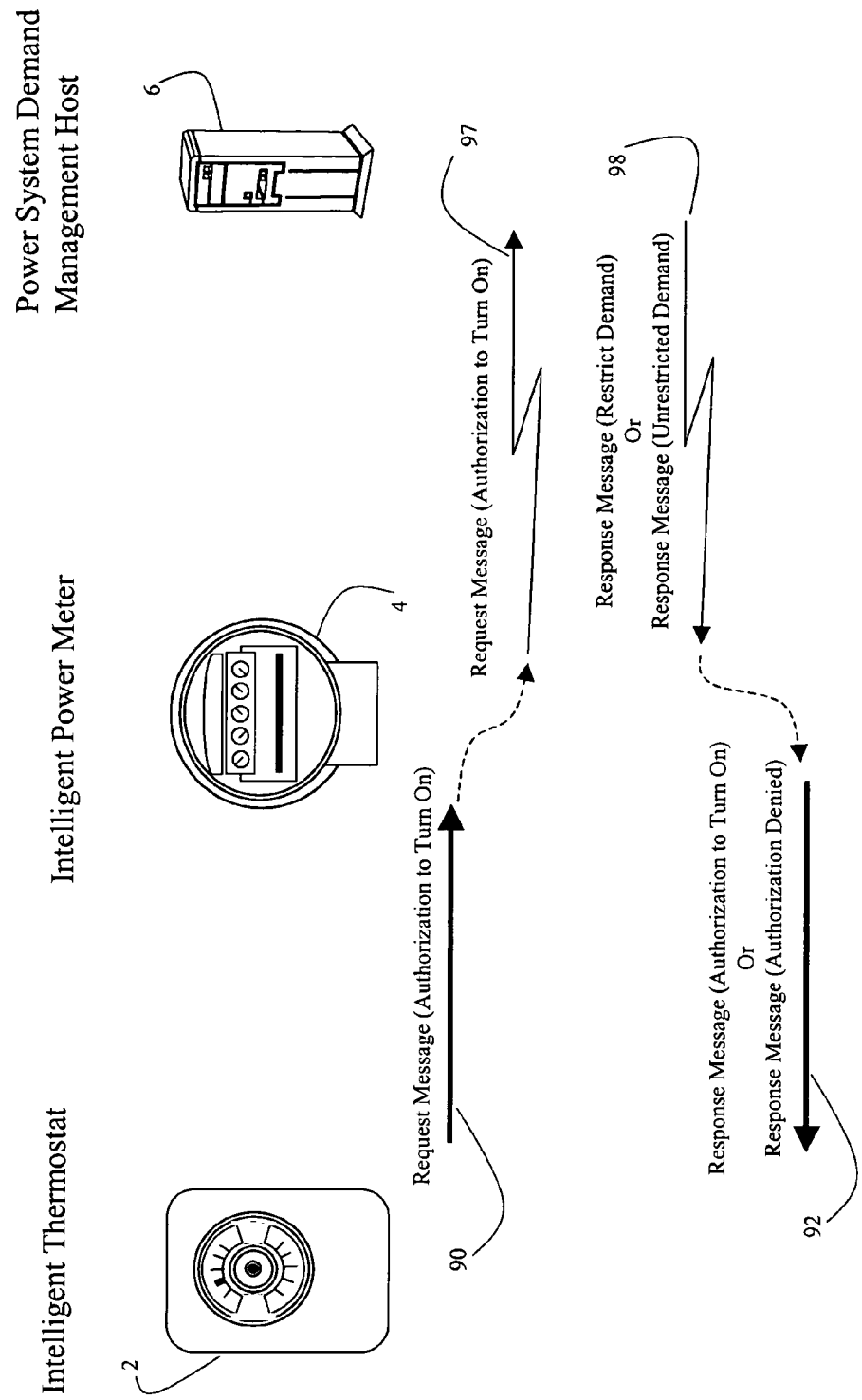
FIG. 13 illustrates yet another embodiment of an energy load control application according to the principles of the present invention.

In FIG. 13, another embodiment is illustrated. In this embodiment, the OPP is largely unaware of the energy management application. Specifically, the OPP functions to relay a message received from an end device in one protocol by mapping it to another protocol sent to the host. The OPP may, in some implementations, convert the messages from the end device from one physical protocol (e.g., 802.15.4) to another protocol (e.g., 802.11X or a wireline based protocol), based on the type of distribution network protocol used between the OPP and the host.

In FIG. 13, the request message 90 is generated by the intelligent thermostat 2 to the OPP 4. The OPP is only required to map the message to a predetermined address associated with the host 6. The request message from the end device 90 is mapped to a request message 97 to the host. The OPP may or may not be aware of the meaning of the messages, namely that the message is a request to activate the power load. The host 6 does interpret and process the message, and returns a response message 98 that is received by the OPP 4, which in turn maps the contents to a message 92 and transmits it to the end device.

FIG. 13 also allows illustration of another concept that can apply to other embodiments. Namely, after the host 6 responds with the response message 98, the host may record the load restriction status (column 87 of FIG. 10) in a data structure associated with the customer. This allows the host to maintain current indications of whether a load restriction request is pending for a given customer. The host may estimate the load 'savings' for each account and maintain a summary of the total load 'savings' for all customers with a pending load restriction. Alternatively, the host may then on an interim basis frequently read usage data from those customers to determine in real time the load reduction that has occurred from initiating a series of load reduction indications. In this manner, the host using the data structure and potentially in combination with the other meter reading capabilities, may be able to obtain feedback regarding the effects of a load reduction initiative.

Figure 14:
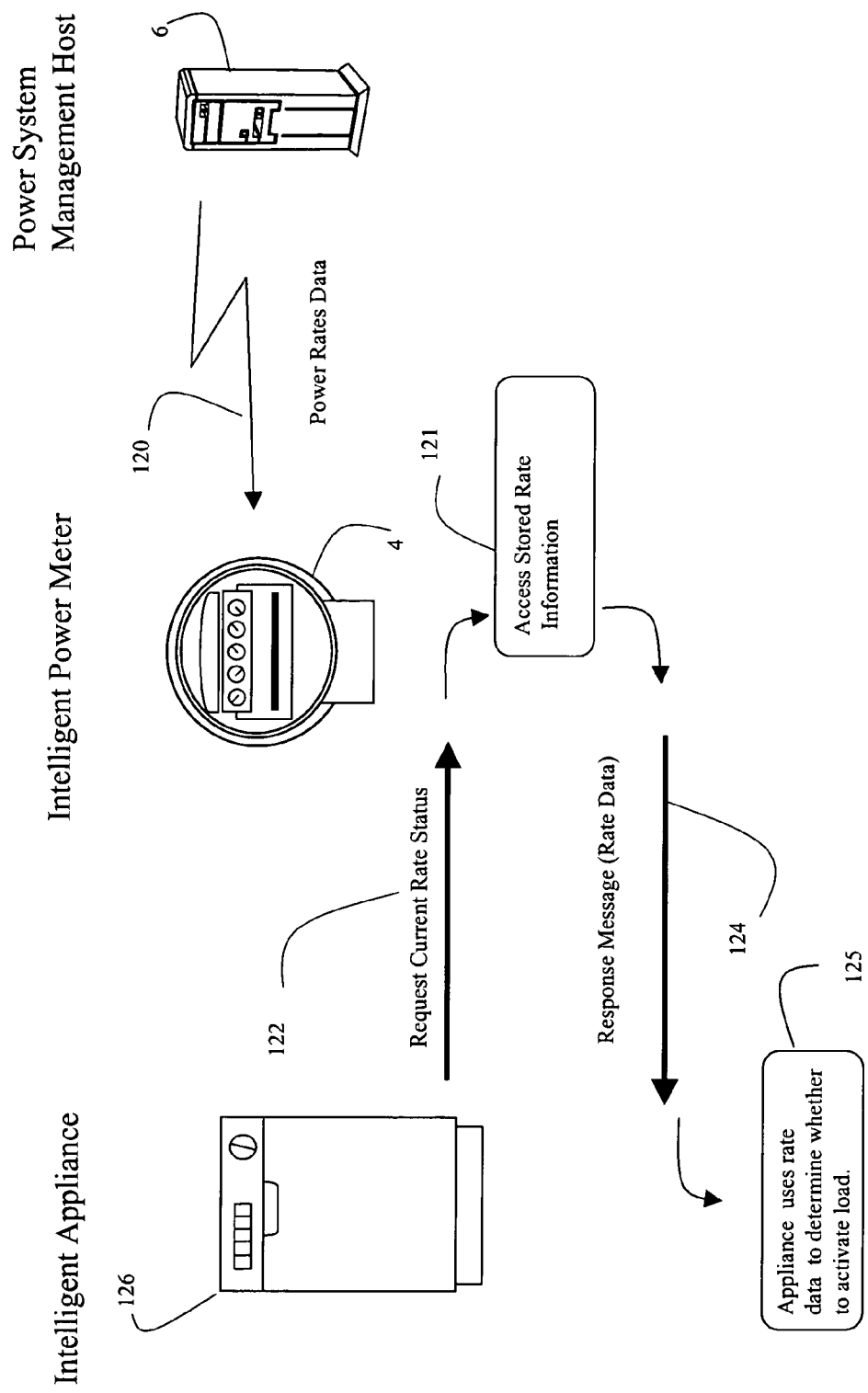
FIG. 14 illustrates yet another embodiment of an energy load control application according to the principles of the present invention.

In other embodiments, the host system can also provide data to the OPP that is used by the OPP to process requests subsequently received by the OPP for yet another variation of energy management. For example, an 'intelligent' appliance may obtain power rate information prior to activating itself. Such rate information could include times when 'off-peak' and 'peak' billing rates occur. Specifically, an appliance or power load may initiate a query for information regarding current power rates and use such information in determining whether to activate the power load. Many appliances, such as A/C units, refrigerators, and dishwashers may be able to defer activation for a short time period if power rates are reduced in the near future. This is embodied in FIG. 14. In FIG. 14, a power system management host 6 sends a notification message 120 conveying power rate data. This data typically includes a time schedule indicating the absolute or relative rate data for power consumption. For example, 'off peak' power rates could be indicated as occurring from 10:00 p.m. to 6:00 a.m. The host 6 periodically provides this information to the OPP 4 that stores the rate data in its memory. This could be done on a daily basis reflecting anticipated power demand.

Subsequently, the intelligent appliance 126 illustrated here as a dishwasher, initiates a query 122 requesting information regarding the rate status. As with the other embodiments, the communication typically occurs using one of the 802-based suite of wireless protocols. The OPP 4 receiving the message performs internal processing 121 to retrieve the rate information stored. The OPP 4 then generates a response message 124 containing the rate data. The OPP may provide a subset of the rate data in the response, e.g. only that data of the schedule pertaining to future times. Upon receipt of the rate data, the intelligent appliance 126 processes the rate data 125 to determine whether it should self activate or defer self activation until an 'off-peak' rate occurs. In this manner, information from the power system management host 6 can be disseminated to a plurality of OPPs, which in turn disseminates the information to an end device allowing the end device to determine whether it should activate or defer activation of a power load.

Another variation of the end device obtaining rate information is possible in which the end device sends a query for rate information to the OPP, and the OPP relays the request to the host. The host responds to the OPP and in turn, the OPP relays the response to the end device. This message flow would be analogous to the message flow of FIG. 12 where the OPP functions to rely information between the end device and host.

Figure 15:
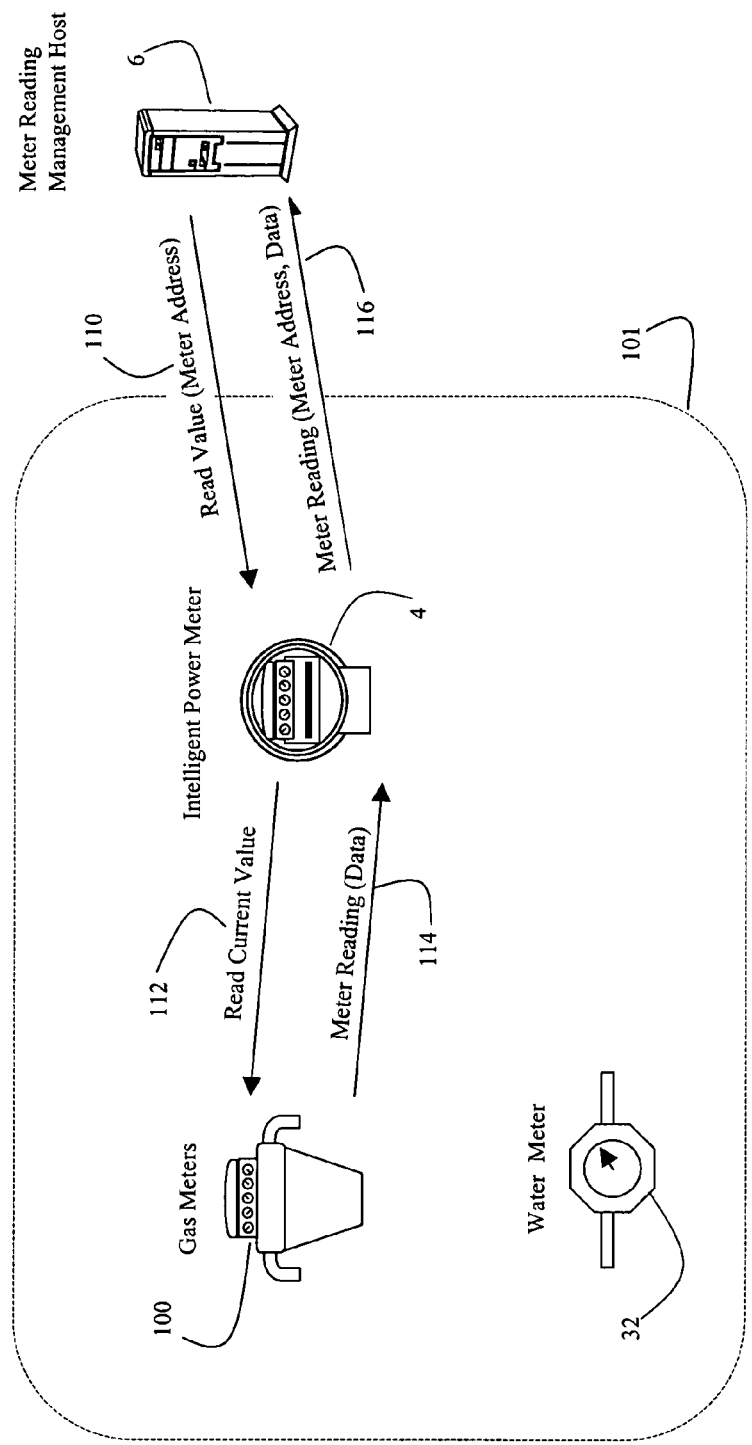
FIG. 15 illustrates an embodiment of an energy load control application involving an appliance according to the principles of the present invention.

The aforementioned system is not limited to energy management for load activation, but can also be used to read data from an electrical meter, or other types of meters. One such embodiment is illustrated in FIG. 15 involving reading values from a gas utility meter. In FIG. 15, the host 6 is a meter reading management system that issues a command 110 to the OPP 4 directing the OPP to read information from the indicated meter. Typically, the meter is identified by a particular address, such as the aforementioned MAC addresses. The OPP 4 receives the request and determines via an address table in memory if there is an established association with the indicated address. In the embodiment of FIG. 14, the OPP 4 is in the nearby vicinity of the three utility meters as indicated by the dotted line 101—the power meter (integrated with the OPP 4), the gas meter 100, and the water meter 32. Thus, the OPP 4 may have established a table with addresses for each of the meters and knows it is able to communicate with each meter. In the case of the gas meter 100 and water meter 32, the OPP typically communicates using one of the 802-based suite of wireless protocols. In the case of the electric meter, reading data may be accomplished using proprietary messaging protocol since the OPP is integrated with the power meter. Alternatively, the OPP and power meter may not be integrated and the OPP uses 802.11X-based protocols to communicate with the power meter. Assuming that the target meter is the gas meter 100 as embodied in FIG. 15, the OPP 4 issues a query or command 112 to the target meter to read the current value. The gas meter 100 returns a response message containing the meter reading data 114, which is received and processed by the OPP 4. The OPP 4 conveys the information in a message 116 to the host. The host then records the data as required in the data structure containing the meter reading data.

Other variations are possible. For example, in FIG. 15 the OPP could autonomously read the meter on a periodic basis (e.g., daily), and store the data in memory. The OPP upon receiving a command from the host could then transmit the plurality of data values to the host. As with the previously illustrated architectures, the OPP may terminate the message from the host and generate different application level messages to the end device (e.g., the gas meter). Alternatively, the OPP may simply relay the message to the end device, as well as relay the response to the host. Alternatively, the OPP may periodically collect data from the remote meter and autonomously send it to the host, or send the data upon request to the host. The data measured, stored, and transmitted may be usage related data from the meter, but may comprise any other data retained in the meter, including status, time, and various power quality parameters, such as voltage dips/spikes, average/peak/low voltage frequencies, maximum current draw, et cetera. The embodiments illustrated and the phrase 'meter reading' is not limited to applications only involving usage data.

Figure 16:
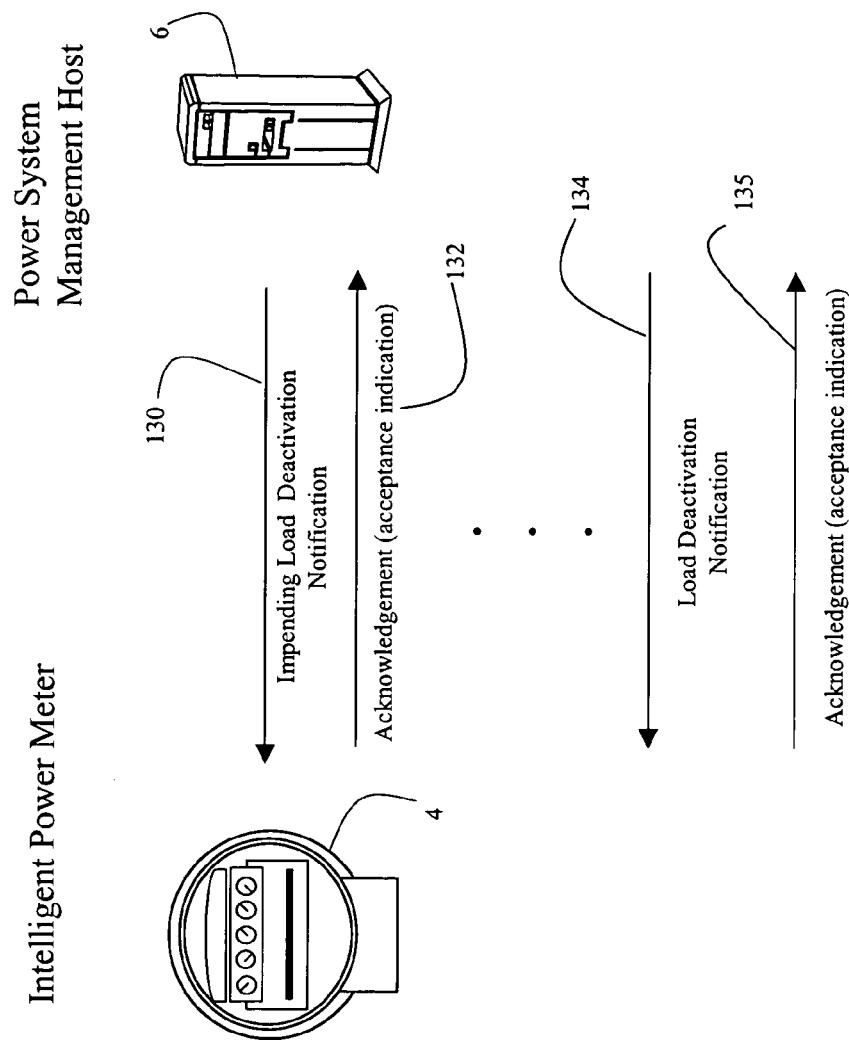
FIG. 16 illustrates an embodiment of an energy load control application involving deactivation of a load according to the principles of the present invention.

FIG. 16 indicates another energy management application directed to emergency load control management. In various applications, the host processor may require deactivation of a load, either in emergency or non-emergency circumstances. In this case, the host may have absolute control over the activation/deactivation of the power load. In FIG. 16, the host 6 issues a message 130 of an impending load deactivation to the OPP 4. This notification message is intended to 'warn' the OPP that an impending power deactivation command should be expected. The OPP 4 responds with an acknowledgement message 132 indicating whether it is able to comply with a future load deactivation or not. This acknowledgement serves at least two functions. First, it confirms receipt of the notification to the host. Second, the host is able to obtain an indication of whether the load can be deactivated. For example, the power management host system may not maintain information about all the load applications under the control of the OPP. Alternatively, various life sustaining medical equipment may be operating as a load from the power meter and the acknowledgement of the OPP may indicate that it cannot comply with a load deactivation request. This may be used by the host to avoid sending a load deactivation request to the OPP.

Assuming the OPP 4 acknowledgement message indicates compliance is expected, at some time the host may issue a load deactivation notification 134 requesting immediate shut down of all loads. After interacting with the power meter to effect the termination of any power at the output of the meter, the OPP issues an acknowledgement message 135 indicating that the power load has been terminated. The host then records this information and may sequence through other OPPs to reduce additional loads until the necessary overload to the power grid is reduced.

The above sequence can be adapted to accomplish deactivation of a meter, typically for non-payment or normal termination of service. A similar 'activation' sequence could be used to activate a meter for establishment of service. This would facilitate normal activation/termination of power service and avoid a service call to the location.

In each of the energy management schemes, variations are possible that are included within the principles of the present invention. For example, although embodiments incorporating an intelligent thermostat are disclosed, the system could apply to any type of electrical controller, including solenoids, mechanical switches, or solid state relays or other electronic components. The power load activated is not limited to motors in A/C units, but any type of motor in a device, including a pump, compressor, machine, drive unit, material handling system, etc. The controller is not limited to controlling power loads, but may control the flow of liquids, gases, or solids through valves, manifolds, gates, or various types of material handling devices. The controller can control industrial machines, processes, lighting, sensors, detectors, or other type of devices. The control mechanism can control access to locations, authorization activation of security systems, or activation of an industrial process. The system can be used to activate/deactivate a device, such that the unit could be taken 'off-line' if necessary. The unit can be remote activated once service is restored.

Although the embodiment discloses a residential type power meter, the OPP could be standalone or integrated into valves, machines, or any of the various types of controllers. The system may be used to read or write data from a particular device, such as reading meter data, including obtaining readings from water or gas utility meters. The information obtained may be usage data, status indications, or periodic usage or rate of use information. Information other than usage that may be obtained by a meter or device can be reported or read to/by the host computer, including water line or gas line pressure readings, line voltage, line voltage dips, voltage frequency, or any other measurable parameter.

I claim:

1. A method for energy management comprising:

receiving energy rating data at an on-premise processor transmitted by a distribution network from a host processor and storing the energy rating data in a memory, the rating data including a schedule pertaining to time and energy costs;

receiving at the on-premise processor a message from an end device requesting energy rating data, wherein the message is communicated using a wireless communication link, the wireless communication link relaying the message through at least one other end device;

retrieving the energy rating data from the memory and sending a response message including the energy rating data using the wireless communications link from the on-premise processor to the end device;

determining independently in the end device whether to generate an activation signal based at least in part on the energy rating data; and the end device allowing or reducing power load consumption according to the determination.

2. The method of claim 1 wherein the activation signal activates a power load.

3. The method of claim 1 wherein the activation signal activates a power generator.

4. The method of claim 1 wherein the energy rating data further comprises a first time period associated with a first usage rate and a second time period associated with a second usage rate.

5. The method of claim 2 wherein the end device determines whether to activate the power load based at least in part on the current time.

6. The method of claim 1 wherein the distribution network transmits the rating data wirelessly.

7. The method of claim 6 wherein the distribution network transmits the rating data wirelessly using an 802.15.4-based communications link.

8. The method of claim 1, wherein the wireless communications link further comprises an 802.15.4-based wireless communications protocol.

9. A method for energy management, comprising:
   sending an energy rate request message from an end device to a host processor, wherein the request message is communicated using a wireless communication link, the wireless communication link relaying the message through at least one other end device;
   receiving at the end device an energy rate schedule from the host processor using the wireless communication link, the energy rate schedule comprising a first time period for a first usage rate and a second time period for a second usage rate;
   determining independently in the end device whether to activate a power load based in part on the energy rate schedule and a current time; and
   the end device allowing or reducing power load consumption according to the determination.

10. The method of claim 9 further comprising storing the energy rate schedule in a memory in the end device.

11. The method of claim 9, wherein the wireless communications link further comprises an 802.15.4-based wireless communications protocol.

12. A method for energy management comprising:
   receiving at an on-premise processor a first request message from an end device pertaining to energy rating data, wherein the first request message is communicated using a wireless communication link, the wireless communication link relaying the first request message through at least one other end device;
   sending from the on-premise processor a second request message over a distribution network from the host processor, the second request message pertaining to energy rating data;
   receiving at the on-premise processor a first rating response message over the distribution network from the host processor, the first rating response message including energy rating data;
   sending from the on-premise processor to the end device a second rating response message using the wireless communication link, the second rating response message including the energy rating data;
   determining independently in the end device whether to generate an activation signal based at least in part on the energy rating data; and
   the end device allowing or reducing power load consumption according to the determination.

13. The method of claim 12 wherein the activation signal activates a power load.

14. The method of claim 12 wherein the activation signal activates a power generator.

15. The method of claim 13 wherein the end device further determines whether to activate the power load based on the current time.

16. The method of claim 12 wherein the energy rating data comprises a first time period associated with a first usage rate and a second time period associated with a second usage rate.

17. The method of clam 13 wherein the power load activated is one from the group of an air conditioning unit, an induction motor, a compressor, and a heating load.

18. The method of claim 12, wherein the wireless communications link further comprises an 802.15.4-based wireless communications protocol.

* * * * *